United States Patent
Shang et al.

(10) Patent No.: US 11,875,748 B2
(45) Date of Patent: Jan. 16, 2024

(54) GATE DRIVING CIRCUIT, DISPLAY SUBSTRATE, DISPLAY DEVICE AND GATE DRIVING METHOD FOR REALIZING FREQUENCY DOUBLING OUTPUT

(71) Applicant: BOE TECHNOLOGY GROUP CO., LTD., Beijing (CN)

(72) Inventors: Guangliang Shang, Beijing (CN); Tian Dong, Beijing (CN); Xinshe Yin, Beijing (CN); Mei Li, Beijing (CN); Libin Liu, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 109 days.

(21) Appl. No.: 17/433,668

(22) PCT Filed: Feb. 24, 2021

(86) PCT No.: PCT/CN2021/077653
§ 371 (c)(1),
(2) Date: Aug. 25, 2021

(87) PCT Pub. No.: WO2021/232871
PCT Pub. Date: Nov. 25, 2021

(65) Prior Publication Data
US 2022/0343855 A1 Oct. 27, 2022

(30) Foreign Application Priority Data
May 22, 2020 (CN) .......................... 202010441743.8

(51) Int. Cl.
*G11C 19/28* (2006.01)
*G09G 3/3266* (2016.01)
(Continued)

(52) U.S. Cl.
CPC ........... *G09G 3/3266* (2013.01); *G11C 19/28* (2013.01); *G09G 3/20* (2013.01); *G09G 3/3233* (2013.01);
(Continued)

(58) Field of Classification Search
CPC ...... G09G 3/3266; G09G 3/20; G09G 3/3233; G09G 2300/0426; G09G 2310/0286; G09G 2320/0247; G09G 2330/021; G11C 19/28
See application file for complete search history.

(56) References Cited

U.S. PATENT DOCUMENTS

2003/0122773 A1* 7/2003 Washio ................ G09G 3/3688
345/103
2005/0231263 A1 10/2005 Kawai
(Continued)

FOREIGN PATENT DOCUMENTS

CN 1755765 A 4/2006
CN 101154360 A 4/2008
(Continued)

OTHER PUBLICATIONS

Extended European Search Report dated Sep. 13, 2022 for application No. EP21772659.5.
(Continued)

*Primary Examiner* — Adam J Snyder
(74) *Attorney, Agent, or Firm* — Nath, Goldberg & Meyer; Joshua B. Goldberg

(57) ABSTRACT

Provided are a gate driving circuit, a display substrate, a display device and a gate driving method, the gate driving circuit includes: a frequency doubling control circuit and an effective output circuit including first shift registers, the first shift register at the first stage has a first signal input terminal coupled with an output control signal line and a second
(Continued)

signal input terminal coupled with the frequency doubling control circuit; the frequency doubling control circuit is coupled to the output control signal line, for providing a frequency doubling control signal thereto after a preset time period from the receipt of the output control signal in response to an output control signal from the output control signal line; the first shift register at the first stage outputs a scanning signal in response to the output control signal and a scanning signal in response to the frequency doubling control signal.

22 Claims, 13 Drawing Sheets

(51) Int. Cl.
*G09G 3/3233* (2016.01)
*G09G 3/20* (2006.01)

(52) U.S. Cl.
CPC .............. *G09G 2300/0426* (2013.01); *G09G 2310/0286* (2013.01); *G09G 2320/0247* (2013.01); *G09G 2330/021* (2013.01)

(56) References Cited

U.S. PATENT DOCUMENTS

| | | | |
|---|---|---|---|
| 2010/0111245 A1 | 5/2010 | Tobita | |
| 2013/0169609 A1 | 7/2013 | Son et al. | |
| 2013/0201090 A1 | 8/2013 | Ohara | |
| 2013/0308743 A1 | 11/2013 | Jinta | |
| 2014/0035891 A1* | 2/2014 | Tanaka | G09G 3/36 345/204 |
| 2014/0055444 A1* | 2/2014 | Jang | G09G 3/3266 345/213 |
| 2014/0219412 A1 | 8/2014 | Chien et al. | |
| 2015/0279481 A1* | 10/2015 | Sasaki | G11C 19/28 377/69 |
| 2016/0012764 A1* | 1/2016 | Xu | G09G 3/3266 345/204 |
| 2016/0240158 A1* | 8/2016 | Xu | G09G 3/3696 |
| 2017/0301295 A1 | 10/2017 | Park et al. | |
| 2018/0061508 A1* | 3/2018 | Chen | G11C 19/28 |
| 2018/0075803 A1 | 3/2018 | Lee et al. | |
| 2018/0122324 A1 | 5/2018 | Cao | |
| 2018/0234090 A1 | 8/2018 | Miyake et al. | |
| 2019/0066582 A1 | 2/2019 | Kim et al. | |
| 2020/0226994 A1 | 7/2020 | Zhang et al. | |
| 2020/0273417 A1* | 8/2020 | Zhao | G09G 3/3614 |
| 2020/0327858 A1 | 10/2020 | Chen et al. | |

FOREIGN PATENT DOCUMENTS

| | | |
|---|---|---|
| CN | 103050077 A | 4/2013 |
| CN | 103943083 A | 7/2014 |
| CN | 104036738 A | 9/2014 |
| CN | 104575354 A | 4/2015 |
| CN | 104867438 A | 8/2015 |
| CN | 105513524 A | 4/2016 |
| CN | 105609074 A | 5/2016 |
| CN | 106297639 A | 1/2017 |
| CN | 106409267 A | 2/2017 |
| CN | 107123407 A | 9/2017 |
| CN | 107731187 A | 2/2018 |
| CN | 108231034 A | 6/2018 |
| CN | 108389541 A | 8/2018 |
| CN | 108831398 A | 11/2018 |
| CN | 109215611 A | 1/2019 |
| CN | 109616056 A | 4/2019 |
| CN | 110164352 A | 8/2019 |
| CN | 111243547 A | 6/2020 |
| CN | 111477181 A | 7/2020 |
| EP | 3611719 A | 2/2020 |
| JP | 2006050288 A | 2/2006 |
| JP | 2006106331 A | 4/2006 |
| JP | 2009080363 A | 4/2009 |
| JP | 2009151587 A | 7/2009 |
| KR | 10-2008-0100580 A | 11/2008 |
| KR | 20080100580 A | 11/2008 |
| KR | 10-2019-0048510 A | 5/2019 |
| WO | 2016065850 A1 | 5/2016 |
| WO | WO-2018188275 A1 * | 10/2018 ............ G09G 3/36 |

OTHER PUBLICATIONS

First Office Action dated Dec. 14, 2020 corresponding to Chinese application No. 202010441743.8.

Bang, Jun-Suk, et al. "A Hybrid Amoled Driver IC for Real-Time TFT Nonuniformity Compensation"; IEEE Journal of Solid-State Circuits; vol. 51, No. 4; Apr. 2016.

Zhu, Ting, et al. "Design Principle and Application of Double-Edge-Triggered Shift Register"; Journal of Zhejiang University (Science Edition); vol. 31, No. 1; Jan. 2004.

Zhang, et al., "Nnew In—Zn—O thin film transistors gate drive cirucit employing input block multiplex structure", China Academic Journal Electronic Publishing House, 1007-2780 (2015) 05-0832-06.

Office Action in corresponding EP application No. 21772659.5 dated May 16, 2023.

Office Action in corresponding CN application No. 202180000301.2 dated May 11, 2023.

English translation of first office action PCT application at national stage.

* cited by examiner

GATE DRIVING CIRCUIT, DISPLAY SUBSTRATE, DISPLAY DEVICE AND GATE DRIVING METHOD FOR REALIZING FREQUENCY DOUBLING OUTPUT

This is a National Phase Application filed under 35 U.S.C. 371 as a national stage of PCT/CN2021/077653, filed Feb. 24, 2021, an application claiming the benefit of Chinese Application No. 202010441743.8, filed May 22, 2020, the content of each of which is hereby incorporated by reference in its entirety.

TECHNICAL FIELD

The present disclosure relates to the field of display technology, and in particular, to a gate driving circuit, a display substrate, a display device, and a gate driving method.

BACKGROUND

At present, in an Active-Matrix Organic Light-Emitting Diode (AMOLED) panel, Pulse Width Modulation (PWM) is generally used to adjust brightness of a pixel unit; specifically, a light emitting control transistor is disposed in a pixel circuit included in the pixel unit, and is used for controlling a time duration when a driving current flows through an Organic Light-Emitting Diode (OLED), so as to precisely control equivalent brightness of the pixel unit.

However, the PWM signal outputted by a gate driving circuit in the related art has a limited frequency, and the PWM signal with a lower frequency may cause the organic light emitting diode to flicker, which can be recognized by naked eye, resulting in a poor display effect.

SUMMARY

The present disclosure is directed to at least one of the technical problems in the related art, and provides a gate driving circuit, a display substrate, a display device and a gate driving method.

In a first aspect, an embodiment of the present disclosure provides a gate driving circuit, including: a frequency doubling control circuit and an effective output circuit, the effective output circuit includes a plurality of first shift registers cascaded, the first shift register at a first stage in the effective output circuit is provided with a first signal input terminal and a second signal input terminal, the first signal input terminal is coupled with an output control signal line, the second signal input terminal is coupled with the frequency doubling control circuit, each of other first shift registers except the first shift register at the first stage in the effective output circuit is provided with a first cascade signal input terminal, and the first cascade signal input terminal of each of the other first shift registers is coupled with a signal output terminal of the first shift register in a previous stage corresponding to said each of the other first shift registers;

the frequency doubling control circuit is coupled with the output control signal line and configured to provide, in response to a control of an output control signal provided by the output control signal line, a frequency doubling control signal to the second signal input terminal after a preset time period elapses from receiving of the output control signal; and the first shift register at the first stage is configured to output a scanning signal in response to a control of the output control signal and to output a scanning signal in response to a control of the frequency doubling control signal.

In some implementations, the frequency doubling control circuit includes a plurality of second shift registers cascaded;

the second shift register at a first stage in the frequency doubling control circuit is provided with a third signal input terminal, and the third signal input terminal is coupled with the output control signal line;

each of other second shift registers except the second shift register at the first stage is provided with a second cascade signal input terminal, the second cascade signal input terminal of each of the other second shift registers is coupled with a signal output terminal of the second shift register at a previous stage corresponding thereto; and the signal output terminal of the second shift register at a last stage in the frequency doubling control circuit is coupled with the second signal input terminal.

In some implementations, in the frequency doubling control circuit, the second shift register includes: a signal writing circuit, a first control circuit, a second control circuit and a signal output circuit;

the signal writing circuit, the first control circuit, the second control circuit, and the signal output circuit are coupled to a first node, both the first control circuit and the second control circuit are coupled to a second node, and both the second control circuit and the signal output circuit are coupled to a third node;

the signal writing circuit is coupled with a corresponding signal input terminal and a first clock signal terminal and is configured to write, in response to a control of a first clock signal provided by the first clock signal terminal, a signal provided by the corresponding signal input terminal into the first node;

the first control circuit is coupled with a first power supply terminal and the first clock signal terminal, and is configured to write a first operating voltage provided by the first power supply terminal into the second node in response to the control of the first clock signal, and to write the first clock signal into the second node in response to a control of a voltage at the first node;

the second control circuit is coupled to a second power supply terminal and a second clock signal terminal, and is configured to write a second clock signal into the third node in response to a control of a voltage at the second node and the second clock signal provided by the second clock signal terminal, and to write a second operating voltage provided by the second power supply terminal to the third node in response to the control of the voltage at the first node;

the signal output circuit is coupled with the first power supply terminal and the second power supply terminal, and is configured to write the first operating voltage into the signal output terminal in response to the control of the voltage at the first node, and to write the second operating voltage into the signal output terminal in response to a control of a voltage at the third node.

In some implementations, the signal writing circuit includes a first transistor; the first control circuit includes a second transistor and a third transistor; the second control circuit includes a fourth transistor, a fifth transistor, a sixth transistor, and a first capacitor; the signal output circuit includes a seventh transistor, an eighth transistor, and a second capacitor, a control electrode of the first transistor is coupled to the first clock signal terminal, a first electrode of the first transistor is coupled to the signal input terminal, and a second electrode of the first transistor is coupled to the first node;

a control electrode of the second transistor is coupled to the first node, a first electrode of the second transistor is coupled to the first clock signal terminal, and a second electrode of the second transistor is coupled to the second node;

a control electrode of the third transistor is coupled to the first clock signal terminal, a first electrode of the third transistor is coupled to the first power supply terminal, and a second electrode of the third transistor is coupled to the second node;

a control electrode of the fourth transistor is coupled to the second node, a first electrode of the fourth transistor is coupled to the second clock signal terminal, and a second electrode of the fourth transistor is coupled to a first electrode of the fifth transistor;

a control electrode of the fifth transistor is coupled to the second clock signal terminal, and a second electrode of the fifth transistor is coupled to the third node;

a control electrode of the sixth transistor is coupled to the first node, a first electrode of the sixth transistor is coupled to the second power supply terminal, and a second electrode of the sixth transistor is coupled to the third node;

a first electrode of the first capacitor is coupled to the second node, and a second electrode of the first capacitor is coupled to the second electrode of the fourth transistor;

a control electrode of the seventh transistor is coupled to the third node, a first electrode of the seventh transistor is coupled to the second power supply terminal, and a second electrode of the seventh transistor is coupled to the signal output terminal;

a control electrode of the eighth transistor is coupled to the first node, a first electrode of the eighth transistor is coupled to the first power supply terminal, and a second electrode of the eighth transistor is coupled to the signal output terminal;

a first electrode of the second capacitor is coupled to the third node, and a second electrode of the third capacitor is coupled to the second power supply terminal.

In some implementations, the second shift register further includes: a noise reduction circuit;

the noise reduction circuit is coupled to the first node, the second node, the second power supply terminal, and the second clock signal terminal, and configured to perform noise reduction on the voltage at the first node in response to the control of the second clock signal and the voltage at the second node.

In some implementations, the noise reduction circuit includes: a ninth transistor, a tenth transistor, and a third capacitor;

a control electrode of the ninth transistor is coupled to the second node, a first electrode of the ninth transistor is coupled to the second power supply terminal, and a second electrode of the ninth transistor is coupled to a first electrode of the tenth transistor;

a control electrode of the tenth transistor is coupled to the second clock signal terminal, and a second electrode of the tenth transistor is coupled to the first node;

a first electrode of the third capacitor is coupled to the first node, and a second electrode of the third capacitor is coupled to the second clock signal terminal.

In some implementations, each first shift register in the effective output circuit has the same circuit configuration as each second shift register in the frequency doubling control circuit.

In some implementations, in the effective output circuit, the first signal input terminal and the second signal input terminal of the first shift register at the first stage are the same signal input terminal.

In some implementations, in the effective output circuit, the first signal input terminal and the second signal input terminal of the first shift register at the first stage are different signal input terminals;

the first shift register at the first stage is provided with a second switch circuit and a third switch circuit;

the second switch circuit is located between the signal writing circuit and the first signal input terminal, is coupled with the second signal input terminal, and is configured to allow, in response to a control of a signal provided by the second signal input terminal, a current between the signal writing circuit and the first signal input terminal or not;

the third switch circuit is arranged between the signal writing circuit and the second signal input terminal, is coupled with the first signal input terminal, and is configured to allow, in response to a control of a signal provided by the first signal input terminal, a current between the signal writing circuit and the second signal input terminal or not.

In some implementations, the second switch circuit includes a twelfth transistor, the third switch circuit includes a thirteenth transistor;

a control electrode of the twelfth transistor is coupled to the second signal input terminal, a first electrode of the twelfth transistor is coupled to the first signal input terminal, and a second electrode of the twelfth transistor is coupled to the signal writing circuit;

a control electrode of the thirteenth transistor is coupled to the first signal input terminal, a first electrode of the thirteenth transistor is coupled to the second signal input terminal, and a second electrode of the thirteenth transistor is coupled to the signal writing circuit.

In some implementations, in the frequency doubling control circuit, the second shift register at the first stage is configured with a first switch circuit disposed between the signal output circuit and the second power supply terminal and coupled to a first switch control terminal, and is configured to allow a current between the signal output circuit and the second power supply terminal or not in response to a control of a first switch control signal provided by the first switch control terminal.

In some implementations, the first switch circuit includes: an eleventh transistor;

a control electrode of the eleventh transistor is coupled to a first switch control terminal, a first electrode of the eleventh transistor is coupled to the second power supply terminal, and a second electrode of the eleventh transistor is coupled to the signal output circuit.

In some implementations, in the frequency doubling control circuit, the second shift register at the first stage is configured with a first switch circuit, the first switch circuit is disposed between the second control circuit and the second clock signal terminal, and is configured to allow a current between the second control circuit and the second clock signal terminal or not in response to a control of a first switch control signal provided by the first switch control terminal.

In some implementations, the first switch circuit includes: an eleventh transistor;
a control electrode of the eleventh transistor is coupled to a first switch control terminal, a first electrode of the eleventh transistor is coupled to the second clock signal terminal, and a second electrode of the eleventh transistor is coupled to the second control circuit.

In some implementations, in the frequency doubling control circuit, the second shift register at the first stage is configured with a first switch circuit, which is disposed between the signal writing circuit and the signal input terminal and coupled to a first switch control terminal, and is configured to allow a current between the signal writing circuit and the signal input terminal or not in response to a control of a first switch control signal provided by the first switch control terminal.

In some implementations, the first switch circuit includes: an eleventh transistor;
a control electrode of the eleventh transistor is coupled to the first switch control terminal, a first electrode of the eleventh transistor is coupled to the signal input terminal, and a second electrode of the eleventh transistor is coupled to the signal writing circuit.

In some implementations, in the frequency doubling control circuit, the second shift register at the first stage is configured with a first power supply circuit;
the first power supply circuit is coupled to the signal writing circuit, the first switch circuit, the first power supply terminal, and the second switch control terminal, and is configured to write the first operating voltage into the signal writing circuit in response to a control of a second switch control signal provided by the second switch control terminal.

In some implementations, the first power supply circuit includes: a fourteenth transistor;
a control electrode of the fourteenth transistor is coupled to the second switch control terminal, a first electrode of the fourteenth transistor is coupled to the first power supply terminal, and a second electrode of the fourteenth transistor is coupled to the signal writing circuit and the first switch circuit.

In some implementations, in the frequency doubling control circuit, the second shift register at the first stage is configured with a second power supply circuit;
the second power supply circuit is coupled to the first power supply terminal, the signal output terminal of the second shift register at the first stage, and a second switch control terminal, and is configured to write the first operating voltage into the signal output terminal of the second shift register in response to a control of a second switch control signal provided by the second switch control terminal.

In some implementations, the second power supply circuit includes: a fifteenth transistor;
a control electrode of the fifteenth transistor is coupled to the second switch control terminal, a first electrode of the fifteenth transistor is coupled to the first power supply terminal, and a second electrode of the fifteenth transistor is coupled to the signal output terminal of the second shift register at the first stage.

In some implementations, the gate driving circuit further includes; an inverter circuit, an input terminal of the inverter circuit is coupled with the first switch control terminal, and an output terminal of the inverter circuit is coupled with the second switch control terminal.

In a second aspect, an embodiment of the present disclosure further provides a display substrate, including: the gate driving circuit provided by the first aspect and a plurality of gate lines in a display area;
the gate lines are coupled with signal output terminals of corresponding first shift registers in the gate driving circuit one to one.

In a third aspect, an embodiment of the present disclosure further provides a display device, including: the display substrate provided in the second aspect and an opposite substrate disposed opposite to the display substrate.

In a fourth aspect, an embodiment of the present disclosure further provides a gate driving method, which is based on the gate driving circuit provided in the first aspect, the gate driving method includes:
in response to an output control signal, sequentially outputting scanning signals by the shift registers at various stages in the effective output circuit, and providing, by the frequency doubling control circuit, a frequency doubling control signal to the second signal input terminal of the first shift register at the first stage in the effective output circuit after a preset time period;
in response to the frequency doubling control signal, sequentially outputting scanning signals by the shift registers at various stages in the effective output circuit.

DRAWINGS

FIG. 2b is a timing diagram illustrating an operation of the gate driving circuit shown in FIG. 2a;

FIG. 6b is a schematic diagram of another circuit configuration of the second shift register at the first stage in FIG. 6a;

FIG. 7b is a schematic diagram of another circuit configuration of the second shift register at the first stage in FIG. 7a;

FIG. 12b is a schematic diagram of another circuit configuration of the first shift register at the first stage in FIG. 12a.

DETAILED DESCRIPTION

In order to make those skilled in the art better understand the technical solutions of the present disclosure, a gate driving circuit, a display substrate, a display device, and a gate driving method provided in the present disclosure are described in detail below with reference to the accompanying drawings.

In the related art, the gate driving circuit is configured with an output control signal line (typically, a frame start signal line, for providing a frame start signal), which is coupled to a shift register at a first stage in the gate driving circuit, for controlling the shift register at the first stage to output a scanning signal, and the shift registers at other stages in the gate driving circuit would output scanning signals in turn. A frequency of the scanning signal output by the shift register at each stage in the gate driving circuit is equal to a frequency of the output control signal provided by the output control signal line. Illustratively, the output control signal has a frequency k, and the scanning signal output by the shift register at each stage in the gate driving circuit of the related art also has a frequency k.

Due to limited capability of an external chip for providing a signal for the output control signal line, the frequency of the output control signal loaded in the output control signal line is limited, so that the frequency of the scanning signal output by the shift register at each stage in the gate driving circuit is limited, and for some application scenarios (for example, displaying a static two-dimensional code, if the frequency of the PWM signal is too low, obvious flicker is caused, and the two-dimensional code is difficult to be accurately identified) requiring a high-frequency PWM signal, the gate driving circuit in the related art cannot meet the high-frequency output requirement.

In order to solve at least one of the technical problems in the related art, the technical solution of the present disclosure provides a gate driving circuit, a display substrate, a display device and a gate driving method.

Figure 1:
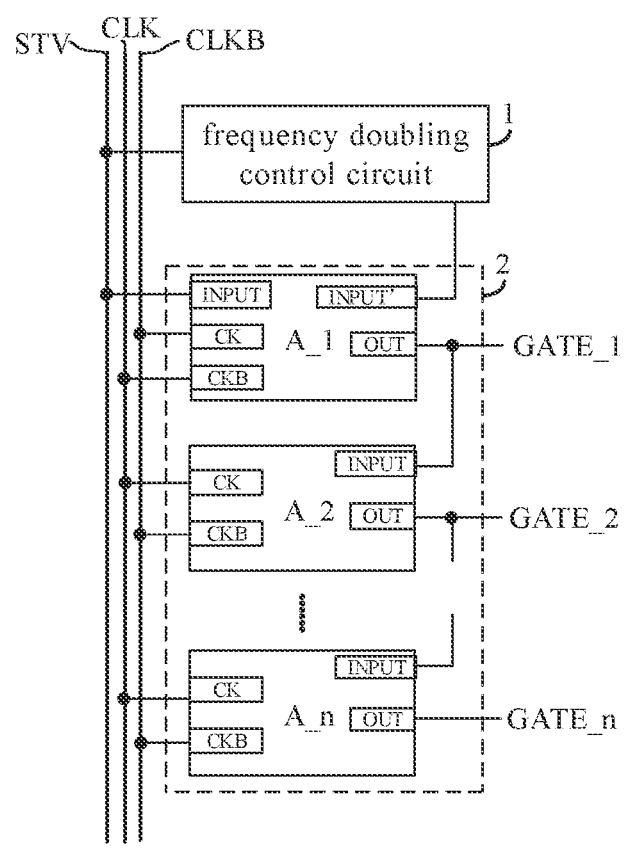
FIG. 1 is a schematic structural diagram of a gate driving circuit according to an embodiment of the present disclosure.

FIG. 1 is a schematic diagram of a circuit configuration of a gate driving circuit according to an embodiment of the present disclosure, and as shown in FIG. 1, the gate driving circuit includes: a frequency doubling control circuit 1 and an effective output circuit 2; where, the effective output circuit 2 includes: a plurality of first shift registers A_1, A_2 . . . A_n cascaded, where n is an integer; the first shift register A_1 at the first stage of the effective output circuit 2 is configured with a first signal input terminal INPUT and a second signal input terminal INPUT', the first signal input terminal INPUT is coupled to an output control signal line, the second signal input terminal INPUT' is coupled to the frequency doubling control circuit 1, each of the first shift registers A_2 . . . A_n of the effective output circuit 2 except the first shift register at the first stage is configured with a first cascade signal input terminal INPUT, and among the first cascade signal input terminals INPUT of the other first shift registers, each first cascade signal input terminal INPUT of a current shift register is coupled to the signal output terminal OUT of the first shift register at the previous stage. In addition, the signal output terminal OUT of each of the first shift registers A_1, A_2 . . . A_n is coupled to a corresponding one of gate lines GATE_1, GATE_2 . . . GATE_n in a display area for providing the scanning signal to the corresponding one of the gate lines GATE_1, GATE_2 . . . GATE_n. It should be noted that, in the embodiment of the present disclosure, the first signal input terminal INPUT and the first cascade signal input terminal INPUT are identical and both are signal input terminals of the first shift register.

The frequency doubling control circuit 1 is coupled to the output control signal line, and is configured to provide a frequency doubling control signal to the second signal input terminal INPUT' after a preset time period has elapsed since the output control signal is received, in response to a control of the output control signal provided by the output control signal line STV.

The first shift register A_1 at the first stage is configured to output a scanning signal in response to a control of the output control signal and to output a scanning signal in response to a control of the frequency doubling control signal. For each of the first shift registers at the other stages, in response to a control of the scanning signal output by the shift register at the previous stage, the first shift register itself outputs the scanning signal. For the whole effective output circuit 2, after the first signal input terminal INPUT or the second signal input terminal INPUT' of the first shift register A_1 at the first stage receives a pulse, the first shift registers A_1, A_2 . . . A_n in each stage of the effective output circuit 2 sequentially output the scanning signal.

In the embodiment of the present disclosure, the output control signal line STV may be a frame start signal line, or may be another signal line set according to actual needs. In the embodiment of the present disclosure, a case where the output control signal line STV being the frame start signal line is taken as an example, and an exemplary description is given. For the gate driving circuit, two clock signal lines CLK and CLKB are provided for supplying clock signals to the shift registers in the gate driving circuit.

Taking that the output control signal provided by the output control signal line STV includes one pulse as an example, an operation process of the gate driving circuit provided by the embodiment of the present disclosure is as follows: in response to the output control signal, the shift registers at various stages in the effective output circuit 2 sequentially output scanning signals, and each scanning signal includes one pulse; meanwhile, the frequency doubling control circuit 1 provides a frequency doubling control signal to the second signal input terminal INPUT' of the first shift register A_1 at the first stage in the effective output circuit 2 after a preset time period, and the output control signal includes one pulse; in response to the frequency doubling control signal, the first shift registers A_1, A_2 . . . A_n at various stages in the effective output circuit 2 sequentially output the scanning signals, and each scanning signal includes one pulse.

A duration of the preset time period may be designed according to actual needs. Taking a certain first shift register in the effective output circuit 2 as an example, the delay time between two consecutive pulses output by the first shift register is the "preset time period".

As can be seen from above, although the output control signal only provides one pulse, the shift register at each stage in the effective output circuit 2 outputs two pulses. Based on the same principle, when the output control signal provides K pulses, the first shift register at each stage in the gate driving circuit can output 2K pulses. Therefore, the gate driving circuit provided by the embodiment of the disclosure can realize frequency doubling output, namely, an upper limit of the frequency of the scanning signal output by the gate driving circuit is improved, and flicker which can be recognized by naked eyes due to the frequency of the PWM signal being too low can be effectively avoided.

In the embodiment of the present disclosure, the frequency doubling control circuit 1 has a delay output function, and the specific circuit configuration of the frequency doubling control circuit 1 is not limited in the technical solution of the present disclosure. The effective output circuit 2 in the embodiment of the present disclosure may be equivalent to the gate driving circuit in the related art, which is capable of providing a scanning signal to a gate line in a display panel, and the specific circuit configuration of the effective output circuit 2 (and the first shift register) is not limited in the technical solution of the present disclosure.

Figure 2A:
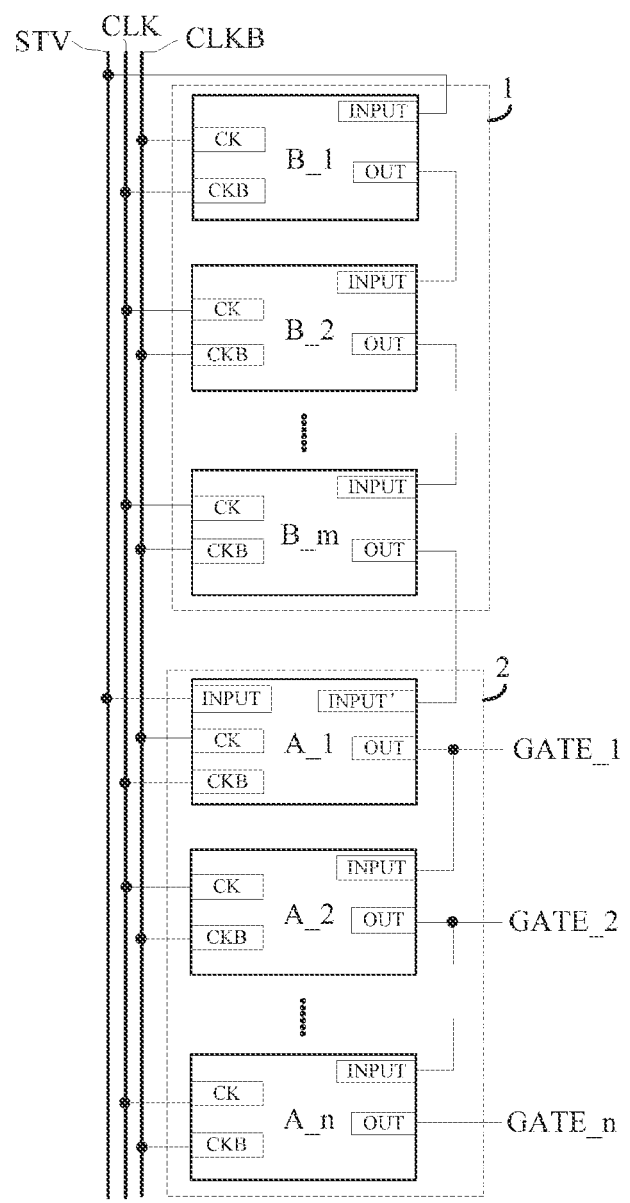
FIG. 2a is another schematic structural diagram of a gate driving circuit according to an embodiment of the present disclosure.
Figure 2B:
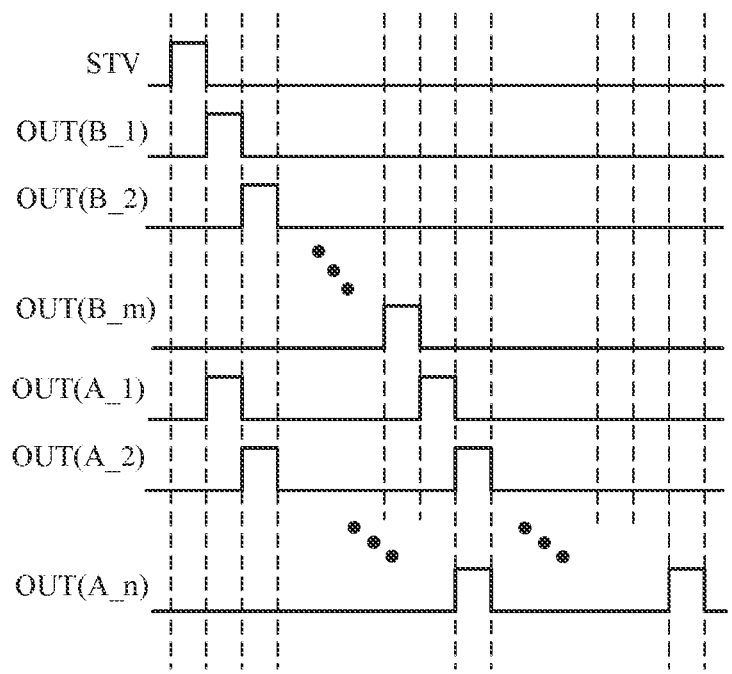

FIG. 2a is another schematic diagram of a gate driving circuit according to an embodiment of the present disclosure, and FIG. 2b is a timing diagram illustrating an operation of the gate driving circuit shown in FIG. 2a; as shown in FIG. 2a and FIG. 2b, the gate driving circuit shown in FIG. 2a is a more specific alternative implementation based on the gate driving circuit shown in FIG. 1, where the frequency doubling control circuit 1 includes: a plurality of second shift registers B_1, B_2 . . . B_m cascaded, where m is an integer; the second shift register at the first stage in the frequency doubling control circuit 1 is provided with a third signal input terminal INPUT, which is coupled to the output control signal line STV; the second shift registers B_2 . . . B_m of the frequency doubling control circuit 1 except for the second shift register B_1 at the first stage are all configured with a second cascade signal input terminal INPUT, and the second cascade signal input terminal INPUT of each of the other second shift registers B_2 . . . B_m is coupled with the signal output terminal OUT of the second shift register at the previous stage; the signal output terminal OUT of the second shift register B_m at the last stage in the frequency doubling control circuit 1 is coupled to the second signal input terminal INPUT'.

In such case, the frequency doubling control circuit 1 is a dummy gate driving circuit in which the second shift registers B_1, B_2 . . . B_m are cascaded, but the frequency doubling control circuit would not provide the scanning signal to the gate line in the display area. The frequency doubling control circuit 1 delays output of the received output control signal (output as a frequency doubling control signal) based on the operating process of signal transmission of the second shift registers B_1, B_2 . . . B_m cascaded in the gate driving circuit.

In practical applications, the number m of the second shift registers included in the frequency doubling control circuit 1 may be designed according to the preset time period and a time difference between outputs of the pulse signals from the second shift registers at two adjacent stages. Illustratively, the preset time period is T, and the time difference between the outputs of the pulse signals from the second shift registers at two adjacent stages is t, then the number of the second shift registers included in the frequency doubling control circuit 1 is T/t.

In the operation timing shown in FIG. 2b, OUT(B_m) represents a signal output terminal of the second shift register B_m at the $m^{th}$ stage, and OUT(A_n) represents a signal output terminal of the first shift register A_n at the $n^{th}$ stage.

It should be noted that, the circuit configuration of the second shift register is not limited in the embodiments of the present disclosure, and the second shift register may adopt any shift register with any existing structure, which will be described below with reference to the accompanying drawings as an example.

Figure 3:
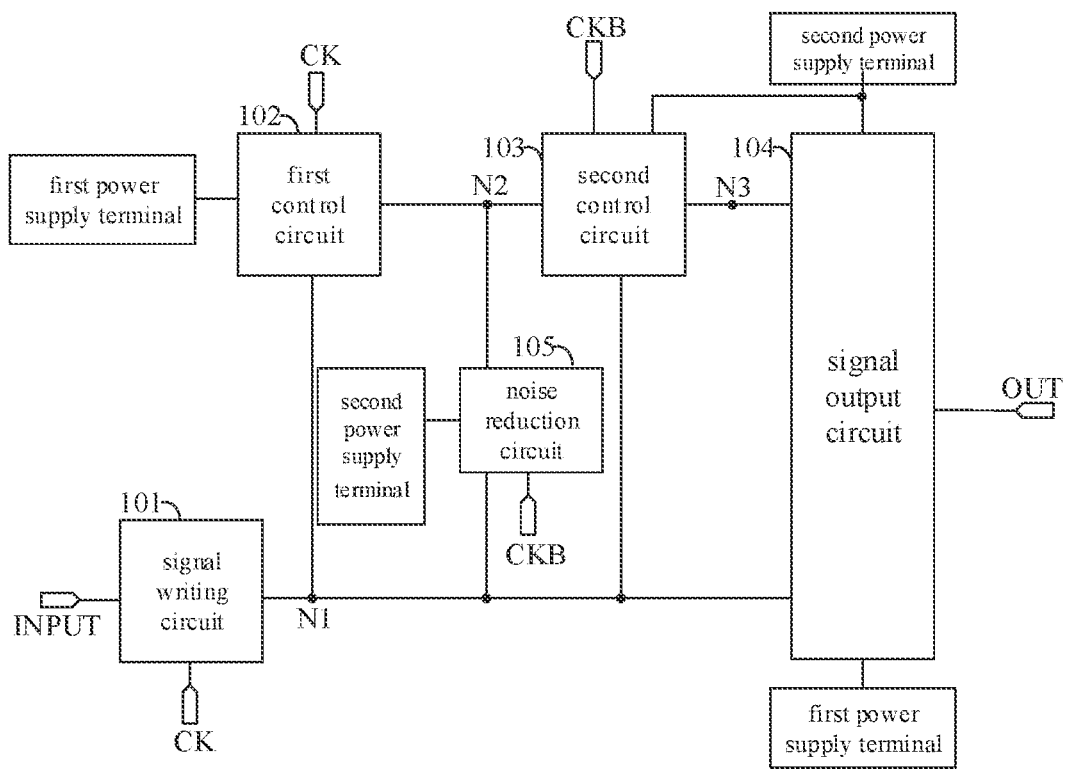
FIG. 3 is a schematic diagram of a circuit configuration of a second shift register according to an embodiment of the present disclosure.

FIG. 3 is a schematic diagram of a circuit configuration of a second shift register according to an embodiment of the present disclosure, and as shown in FIG. 3, the second shift register includes: a signal writing circuit 101, a first control circuit 102, a second control circuit 103, and a signal output circuit 104; the signal writing circuit 101, the first control circuit 102, the second control circuit 103, and the signal output circuit 104 are coupled to a first node N1, both the first control circuit 102 and the second control circuit 103 are coupled to a second node N2, and the second control circuit 103 and the signal output circuit 104 are coupled to a third node N3.

The signal writing circuit 101 is coupled to a corresponding signal input terminal INPUT and a first clock signal terminal CK, and configured to write a signal provided by the corresponding signal input terminal into the first node N1 in response to a control of a first clock signal provided by the first clock signal terminal CK.

The first control circuit 102 is coupled to a first power supply terminal and the first clock signal terminal CK, and is configured to write a first operating voltage supplied from the first power supply terminal into the second node N2 in response to the control of the first clock signal, and to write the first clock signal into the second node N2 in response to a control of a voltage at the first node N1.

The second control circuit 103 is coupled to a second power supply terminal and a second clock signal terminal CKB, and is configured to write a second clock signal provided by the second clock signal terminal CKB into the third node N3 in response to a control of a voltage at the second node N2 and the second clock signal, and to write a second operating voltage provided by the second power supply terminal into the third node N3 in response to the control of the voltage at the first node N1.

The signal output circuit 104 is coupled to the first power supply terminal and the second power supply terminal, and is configured to write the first operating voltage into the signal output terminal OUT in response to the control of the voltage at the first node N1, and to write the second operating voltage into the signal output terminal OUT in response to the control of a voltage at the third node N3.

In some implementations, the second shift register further includes: a noise reduction circuit, the noise reduction circuit is coupled to the first node N1, the second node N2, the second power supply terminal, and the second clock signal terminal CKB, and is configured to reduce noise of the voltage at the first node N1 in response to the control of the second clock signal and the voltage at the second node N2.

Figure 4:
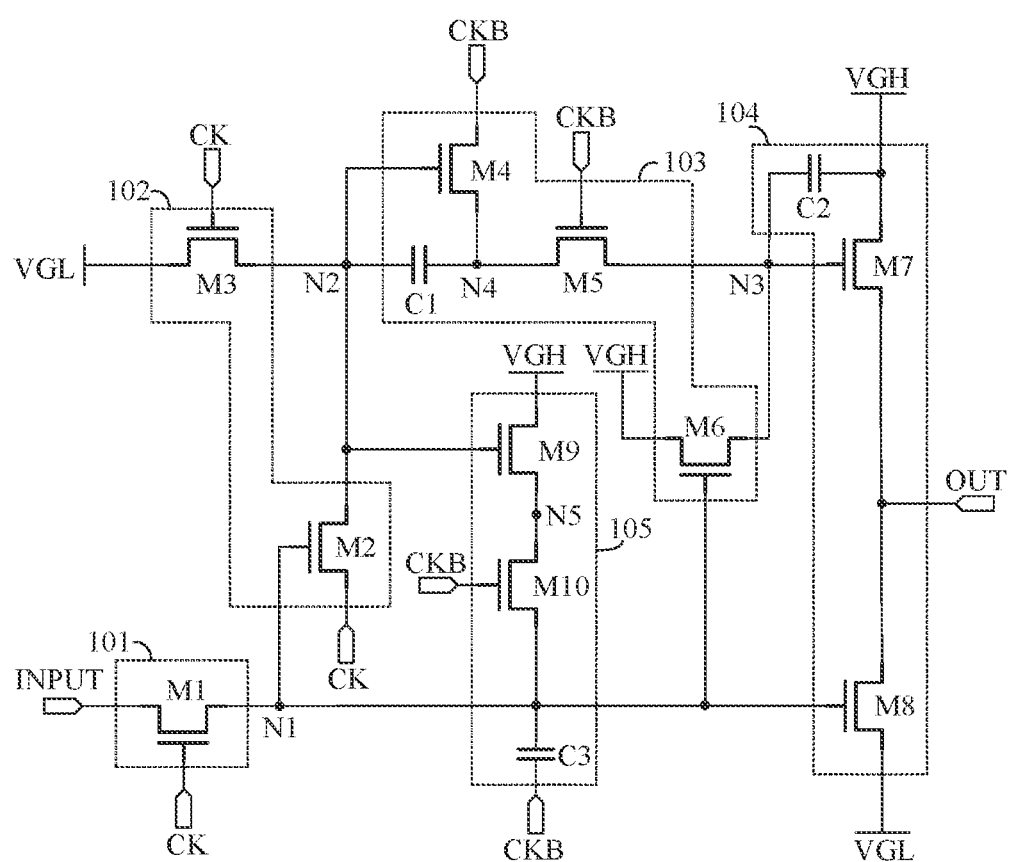
FIG. 4 is a schematic diagram of another circuit configuration of the second shift register shown in FIG. 3.

FIG. 4 is a schematic diagram of a circuit configuration of the second shift register shown in FIG. 3, and as shown in FIG. 4, the second shift register shown in FIG. 4 is an alternative implementation based on the second shift register shown in FIG. 3.

In some implementations, the signal writing circuit 101 includes a first transistor M1, the first control circuit 102 includes a second transistor M2 and a third transistor M3, the second control circuit 103 includes a fourth transistor M4, a fifth transistor M5, a sixth transistor M6 and the first capacitor C1, the signal output circuit 104 includes a seventh transistor M7, an eighth transistor M8 and a second capacitor C2.

A control electrode of the first transistor M1 is coupled to the first clock signal terminal CK, a first electrode of the first transistor M1 is coupled to the signal input terminal INPUT, and a second electrode of the first transistor M1 is coupled to the first node N1.

A control electrode of the second transistor M2 is coupled to the first node N1, a first electrode of the second transistor M2 is coupled to the first clock signal terminal CK, and a second electrode of the second transistor M2 is coupled to the second node N2.

A control electrode of the third transistor M3 is coupled to the first clock signal terminal CK, a first electrode of the third transistor M3 is coupled to the first power supply terminal, and a second electrode of the third transistor M3 is coupled to the second node N2.

A control electrode of the fourth transistor M4 is coupled to the second node N2, a first electrode of the fourth transistor M4 is coupled to the second clock signal terminal CKB, and a second electrode of the fourth transistor M4 is coupled to a first electrode of the fifth transistor M5.

A control electrode of the fifth transistor M5 is coupled to the second clock signal terminal CKB, and a second electrode of the fifth transistor M5 is coupled to the third node N3.

A control electrode of the sixth transistor M6 is coupled to the first node N1, a first electrode of the sixth transistor M6 is coupled to the second power supply terminal, and a second electrode of the sixth transistor M6 is coupled to the third node N3.

A first electrode of the first capacitor C1 is coupled to the second node N2, and a second electrode of the first capacitor C1 is coupled to the second electrode of the fourth transistor M4.

A control electrode of the seventh transistor M7 is coupled to the third node N3, a first electrode of the seventh transistor M7 is coupled to the second power supply terminal, and a second electrode of the seventh transistor M7 is coupled to the signal output terminal OUT.

A control electrode of the eighth transistor M8 is coupled to the first node N1, a first electrode of the eighth transistor M8 is coupled to the first power supply terminal, and a second electrode of the eighth transistor M8 is coupled to the signal output terminal OUT.

A first electrode of the second capacitor C2 is coupled to the third node, and a second electrode of the second capacitor C2 is coupled to the first power supply terminal.

In some implementations, the noise reduction circuit includes: a ninth transistor M9, a tenth transistor M10, and a third capacitor C3.

A control electrode of the ninth transistor M9 is coupled to the second node N2, a first electrode of the ninth transistor M9 is coupled to the second power supply terminal, and a second electrode of the ninth transistor M9 is coupled to a first electrode of the tenth transistor M10.

A control electrode of the tenth transistor M10 is coupled to the second clock signal terminal CKB, and a second electrode of the tenth transistor M10 is coupled to the first node N1.

A first electrode of the third capacitor C3 is coupled to the first node N1, and a second electrode of the third capacitor C3 is coupled to the second clock signal terminal CKB.

In the embodiments of the present disclosure, each of the transistors may be independently selected from one of a polysilicon thin film transistor, an amorphous silicon thin film transistor, an oxide thin film transistor, and an organic thin film transistor. The "control electrode" referred in the embodiments of the present disclosure specifically refers to a gate of a transistor, a "first electrode" specifically refers to a source of the transistor, and a corresponding "second electrode" specifically refers to a drain of the transistor. Certainly, one ordinary skilled in the art will recognize that the "first electrode" and "second electrode" are interchangeable.

In addition, the transistors can be divided into N-type transistors and P-type transistors, and each transistor in the present disclosure may be independently selected from an N-type transistor or a P-type transistor; in the following embodiments, all the transistors in the pixel unit are P-type transistors, and the transistors in the second shift register can be simultaneously manufactured by the same manufacturing process. Accordingly, the first operating voltage provided by the first power supply terminal is a low-level voltage VGL, and the second operating voltage provided by the second power supply terminal is a high-level voltage VGH. The operation of the second shift register shown in FIG. 4 will be described in detail with reference to the accompanying drawings.

Figure 5:
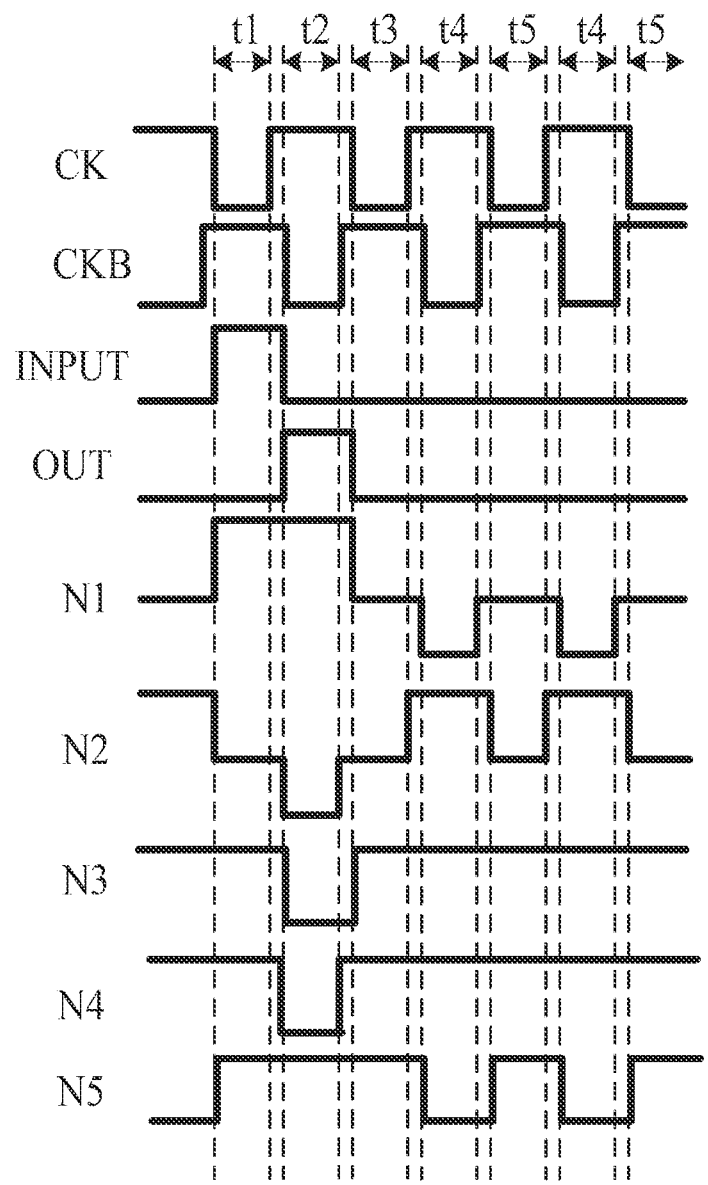
FIG. 5 is a timing diagram illustrating an operation of the second shift register shown in FIG. 4.

FIG. 5 is a timing chart showing the operation of the second shift register shown in FIG. 4, and as shown in FIG. 5, the operation of the second shift register includes the following stages t1 to t5.

In a first stage t1, the first clock signal provided by the first clock signal terminal CK is in a low level state, the second clock signal provided by the second clock signal terminal CKB is in a high level state, and the signal provided by the third signal input terminal INPUT is in a high level state. In such case, the first transistor M1, the third transistor M3, the fourth transistor M4, and the ninth transistor M9 are turned on, and the second transistor M2, the fifth transistor M5, the sixth transistor M6, the seventh transistor M7, the eighth transistor M8, and the tenth transistor M10 are turned off.

Specifically, since the first clock signal is in a low level state, the first transistor M1 and the third transistor M3 are both turned on, a signal in a high level state provided by the third signal input terminal INPUT is written into the first node N1 through the first transistor M1, the first operating voltage VGL is written into the second node N2 through the third transistor M3, the first node N1 is in a high level state, and the second node N2 is in a low level state.

Since the first node N1 is in a high level state, the sixth transistor M6 and the eighth transistor M8 are turned off. Since the second node N2 is in a low level state, the fourth transistor M4 and the ninth transistor M9 are turned on, the second clock signal in a high level state is written into the fourth node N4 through the fourth transistor M4, and the second operating voltage VGH is written into a fifth node N5 through the ninth transistor M9. In such case, the first electrode of the first capacitor C1 is in a low level state, and the second electrode of the first capacitor C1 is in a high level state.

Since the second clock signal is in a high level state, the fifth transistor M5 and the tenth transistor M10 are turned off. Since both the fifth transistor M5 and the sixth transistor M6 are turned off, the third node N3 is in a floating state, the voltage at the third node N3 is maintained in the previous high level state, and the seventh transistor M7 is turned off.

Since both the seventh transistor M7 and the eighth transistor M8 are turned off, the signal output terminal OUT is in a floating state, and the voltage at the signal output terminal OUT is maintained in the previous low level state.

In a second stage t2, the first clock signal provided by the first clock signal terminal CK is in a high level state, the second clock signal provided by the second clock signal terminal CKB is in a low level state, and the signal provided by the third signal input terminal INPUT is in a low level state. In such case, the fourth transistor M4, the fifth transistor M5, the seventh transistor M7, the ninth transistor M9 and the tenth transistor M10 are turned on, and the first transistor M1, the second transistor M2, the third transistor M3, the sixth transistor M6 and the eighth transistor M8 are turned off.

Specifically, since the first clock signal is in a high level state, both the first transistor M1 and the third transistor M3 are turned off. Since the second clock signal is in a low level state, the fifth transistor M5 and the tenth transistor M10 are turned on, and in such case, the second operating voltage VGH is written into the first node N1 through the ninth transistor M9 and the tenth transistor M10 to maintain the first node N1 in a high level state, so that the noise reduction processing on the first node N1 is realized, and the second transistor M2 and the eighth transistor M8 maintain turned off. In such case, the first electrode of the third capacitor C3 is at a high level state, and the second electrode of the third capacitor C3 is at a low level state.

Meanwhile, since the second clock signal in the low level state is written into the fourth node N4 through the fourth transistor M4, the voltage at the fourth node N4 changes from the high level state to the low level state, and since the first electrode of the first capacitor C1 is in the floating state, the voltage at the second node N2 is pulled down to a lower level state under the bootstrap action of the first capacitor C1.

Since the fifth transistor M5 is turned on, the second clock signal in a low level state is written into the third node N3 through the fourth transistor M4 and the fifth transistor M5, the third node N3 is in a low level state, the seventh transistor M7 is turned on, the second operating voltage VGH is written into the signal output terminal OUT through the seventh transistor M7, and the signal output terminal OUT outputs a high level signal.

In a third stage 13, the first clock signal provided by the first clock signal terminal CK is in a low level state, the second clock signal provided by the second clock signal terminal CKB is in a high level state, and the signal provided by the third signal input terminal INPUT is in a low level state. In such case, the first transistor M1, the second transistor M2, the third transistor M3, the fourth transistor M4, the sixth transistor M6, the eighth transistor M8, and the ninth transistor M9 are turned on, and the fifth transistor M5, the seventh transistor M7, and the tenth transistor M10 are turned off.

Specifically, since the first clock signal is in a low level state, the first transistor M1 and the third transistor M3 are both turned on, the signal in a low level state provided by the third signal input terminal INPUT is written into the first node N1 through the first transistor M1, the first operating voltage VGL is written into the second node N2 through the third transistor M3, the first node N1 is in a low level state, and the second node N2 is in a low level state. The first electrode of the third capacitor C3 is in a low level state, and the second electrode of the third capacitor C3 is in a high level state.

Since the first node N1 is in a low level state, the sixth transistor M6 and the eighth transistor M8 are turned on. Since the second node N2 is in a low level state, the fourth transistor M4 and the ninth transistor M9 are turned on, the second clock signal in a high level state is written into the fourth node N4 through the fourth transistor M4, and the second operating voltage VGH is written into the fifth node N5 through the ninth transistor M9. In such case, the first electrode of the first capacitor C1 is in a low level state, and the second electrode of the first capacitor C1 is in a high level state.

Since the second clock signal is in a high level state, the fifth transistor M5 and the tenth transistor M10 are turned off. Since the fifth transistor M5 and the tenth transistor M10 are both turned off, the second operating voltage VGH is written into the third node N3 through the sixth transistor M6, and the third node N3 is in a high level state.

Since the first node N1 is in a low level state and the third node N3 is in a high level state, the seventh transistor M7 is turned off, the eighth transistor M8 is turned on, the first operating voltage VGL is written into the signal output terminal OUT through the eighth transistor M8, and the signal output terminal OUT outputs a low level signal.

In a fourth stage t4, the first clock signal provided by the first clock signal terminal CK is in a high level state, the second clock signal provided by the second clock signal terminal CKB is in a low level state, and the signal provided by the third signal input terminal INPUT is in a low level state. In such case, the second transistor M2, the fifth transistor M5, the sixth transistor M6, the eighth transistor M8, and the tenth transistor M10 are turned on, and the first transistor M1, the third transistor M3, the fourth transistor M4, the seventh transistor M7, and the ninth transistor M9 are turned off.

Specifically, since the first clock signal is in a high level state, both the first transistor M1 and the third transistor M3 are turned off. Since the first transistor M1 is turned off, the first node N1 is in a floating state; and since the second clock signal is switched from a high level state to a low level state, under the bootstrap action of the third capacitor C3, the voltage at the first node N1 is pulled down to a lower level state, so as to perform noise reduction processing on the first node NL. In such case, the second transistor M2, the sixth transistor M6, and the eighth transistor M8 are all turned on. The second operating voltage VGH is written into the third node N3 through the sixth transistor M6.

Since the second transistor M2 is turned on, the first clock signal in a high level state is written into the second node N2 through the second transistor M2, the second node N2 is in a high level state, and the fourth transistor M4 is turned off.

Since the second clock signal is in a low level state, the fifth transistor M5 and the tenth transistor M10 are turned on, and in such case, the voltage at the fourth node N4 is equal to the voltage at the third node N3, the voltage at the fifth node N5 is equal to the voltage at the first node N1, that is, the voltage at the fourth node N4 is in a high level state, and the voltage at the fifth node N5 is in a low level state.

Since the first node N1 is in a low level state and the third node N3 is in a high level state, the seventh transistor M7 is turned off, the eighth transistor M8 is turned on, the first operating voltage VGL is written into the signal output terminal OUT through the eighth transistor M8, and the signal output terminal OUT outputs a low level signal.

In a fifth stage t5, the first clock signal provided by the first clock signal terminal CK is in a low level state, the second clock signal provided by the second clock signal terminal CKB is in a high level state, and the signal provided by the third signal input terminal INPUT is in a low level state. In such case, the first transistor M1, the second transistor M2, the third transistor M3, the fourth transistor M4, the sixth transistor M6, the eighth transistor M8, and the ninth transistor M9 are turned on, and the fifth transistor M5, the seventh transistor M7, and the tenth transistor M10 are turned off.

Specifically, since the first clock signal is in a low level state, the first transistor M1 and the third transistor M3 are both turned on, the signal in a low level state provided by the third signal input terminal INPUT is written into the first node N1 through the first transistor M1, the first operating voltage VGL is written into the second node N2 through the third transistor M3, the first node N1 is in a low level state, and the second node N2 is in a low level state. The first electrode of the third capacitor C3 is in a low level state, and the second electrode of the third capacitor C3 is in a high level state.

Since the first node N1 is in a low level state, the sixth transistor M6 and the eighth transistor M8 are turned on. Since the second node N2 is in a low level state, the fourth transistor M4 and the ninth transistor M9 are turned on, the second clock signal in a high level state is written into the fourth node N4 through the fourth transistor M4, and the second operating voltage VGH is written into the fifth node N5 through the ninth transistor M9. In such case, the first electrode of the first capacitor C1 is in a low level state, and the second electrode of the first capacitor C1 is in a high level state.

Since the second clock signal is in a high level state, the fifth transistor M5 and the tenth transistor M10 are turned off. Since the fifth transistor M5 and the tenth transistor M10 are both turned off, the second operating voltage VGH is written into the third node N3 through the sixth transistor M6, and the third node N3 is in a high level state.

Since the first node N1 is in a low level state and the third node N3 is in a high level state, the seventh transistor M7 is turned off, the eighth transistor M8 is turned on, the first operating voltage VGL is written into the signal output terminal OUT through the eighth transistor M8, and the signal output terminal OUT outputs a low level signal.

Then, the fourth stage t4 and the fifth stage t5 are performed alternately, the signal output terminal OUT keeps outputting the low level signal until the signal provided by the third signal input terminal INPUT is in the high level state, and the second shift register operates in a first stage t1 of a next cycle.

It should be noted that the circuit configuration of the second shift register shown in FIG. 4 is only used for exemplary purposes, and does not limit the technical solution of the present disclosure.

In some implementations, the first shift register in the effective output circuit 2 has the same circuit configuration as that of the second shift register in the frequency doubling control circuit 1, and in such case, the circuit configuration design of the whole gate driving circuit can be simplified.

Illustratively, the first clock signal terminal CK of the first/second shift register at the odd-numbered stage is coupled to the clock signal line CLK, and the second clock signal terminal CKB of the first/second shift register at the even-numbered stage is coupled to the clock signal line CLKB.

Figure 6A:
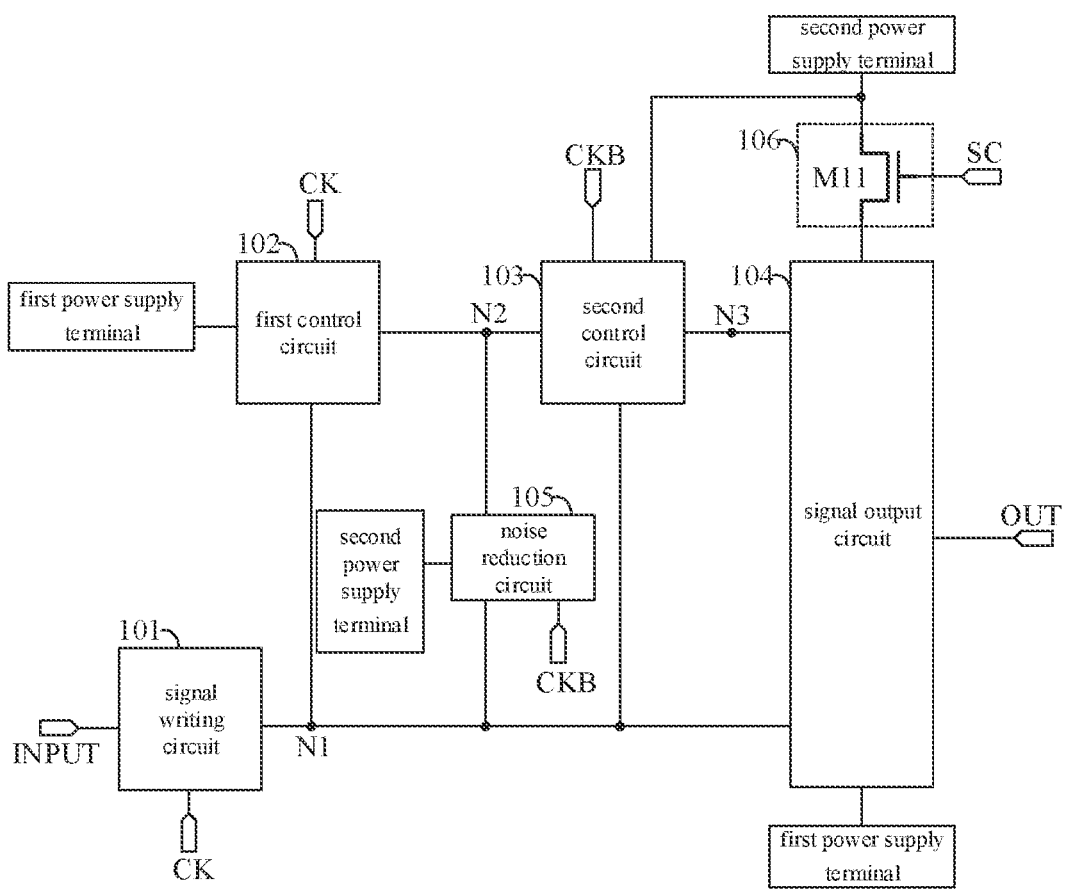
FIG. 6a is a schematic diagram of a circuit configuration of a second shift register at a first stage according to an embodiment of the present disclosure.

FIG. 6a is a schematic diagram of a circuit configuration of a second shift register at a first stage according to an embodiment of the present disclosure, and as shown in FIG. 6a, the second shift register shown in FIG. 6a is an improvement based on the second shift register shown in FIG. 3.

In some implementations, in order to control on and off of the "frequency doubling function" of the gate driving circuit, in the frequency doubling control circuit 1, the second shift register B_1 at the first stage is configured with a first switch circuit 106; the first switch circuit 106 is disposed between the signal output circuit 104 in the second shift register at the first stage and the second power supply terminal, and the first switch circuit 106 is configured to allow a current between the signal output circuit 104 and the second power supply terminal or not.

Specifically, when a current is allowed to flow through the first switch circuit 106, i.e., the first switch circuit 106 is turned on, a current is allowed between the signal output circuit 104 in the second shift register at the first stage and the second power supply terminal, the second shift register at the first stage can operate normally, and the frequency doubling function of the gate driving circuit is switched on; when no current is allowed to flow through the first switch circuit 106, i.e., the first switch circuit 106 is turned off, no current is allowed between the signal output circuit 104 in the second shift register B_1 at the first stage and the second power supply terminal, the second shift register B_1 at the first stage cannot operate normally, and the frequency doubling function of the gate driving circuit is switched off.

Figure 6B:
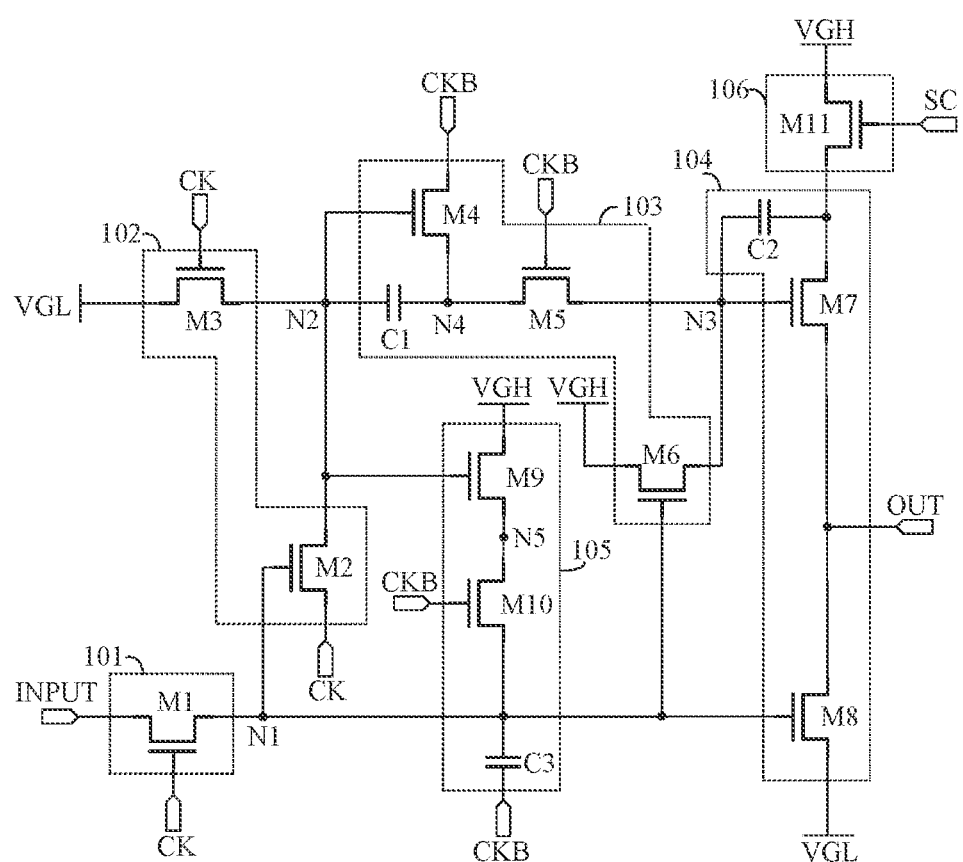

FIG. 6b is a schematic diagram of an alternative circuit configuration of the second shift register in the first stage shown in FIG. 6a, and as shown in FIG. 6b, specific circuits of the signal writing circuit 101, the first control circuit 102, the second control circuit 103 and the signal output circuit 104 in FIG. 6b may adopt those as shown in FIG. 4.

It should be noted that the case shown in FIG. 6b only serves as an example, and in the embodiment of the present disclosure, the signal writing circuit 101, the first control circuit 102, the second control circuit 103, and the signal output circuit 104 may also adopt other circuit configurations, which are not illustrated here.

Figure 7A:
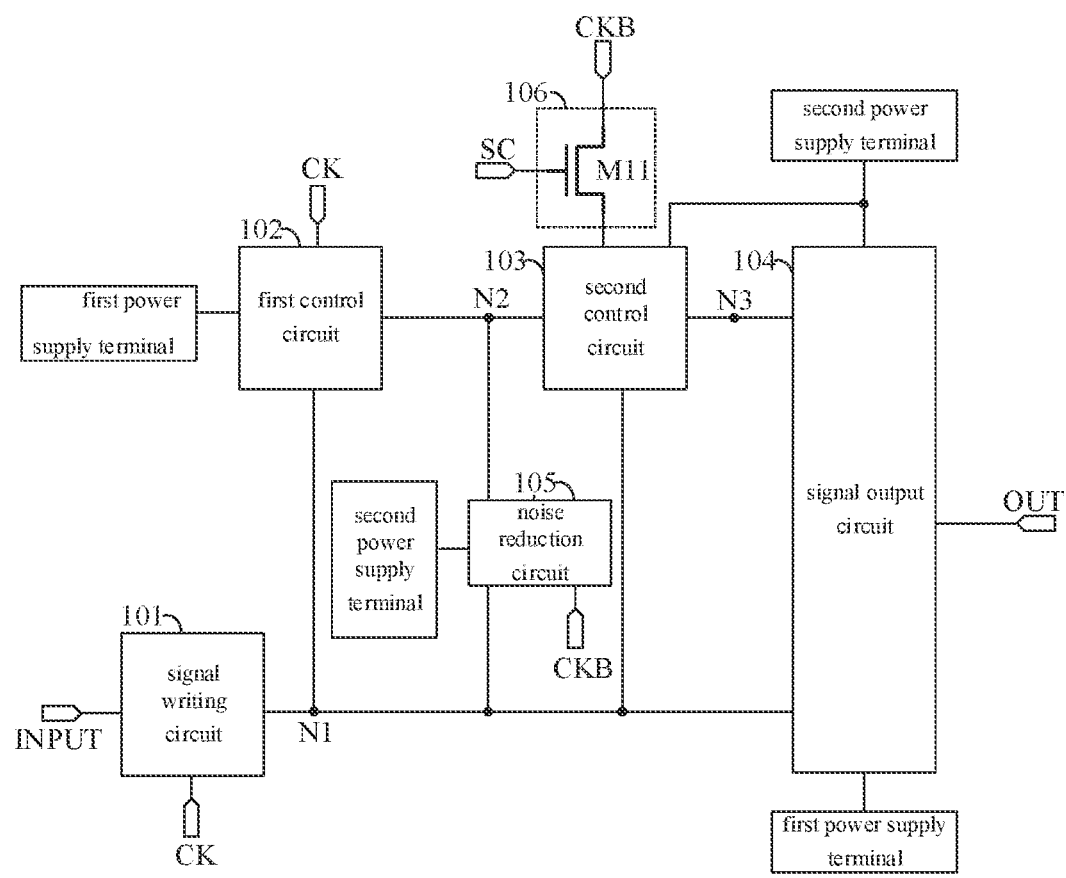
FIG. 7a is a schematic diagram of another circuit configuration of the second shift register at the first stage according to an embodiment of the present disclosure.

FIG. 7a is schematic diagram of another circuit configuration of the second shift register at the first stage in the embodiment of the present disclosure, and as shown in FIG. 7a, different from the case shown in FIG. 6a, the first switch circuit 106 in FIG. 7a is disposed between the second control circuit 103 in the second shift register B_1 at the first stage and the second clock signal terminal CKB, and the first switch circuit 106 is configured to allow a current between the second control circuit 103 and the second clock signal terminal CKB or not.

Specifically, when the first switch circuit 106 is turned on, a current is allowed between the second control circuit 103 in the second shift register B_1 at the first stage and the second clock signal terminal, the second shift register B_1 at the first stage can normally operate, and the frequency doubling function of the gate driving circuit is switched on; when the first switch circuit 106 is turned off, no current is allowed between the second control circuit 103 in the second shift register B_1 at the first stage and the second clock signal terminal, the second shift register B_1 at the first stage cannot operate normally, and the frequency doubling function of the gate driving circuit is switched off.

Figure 7B:
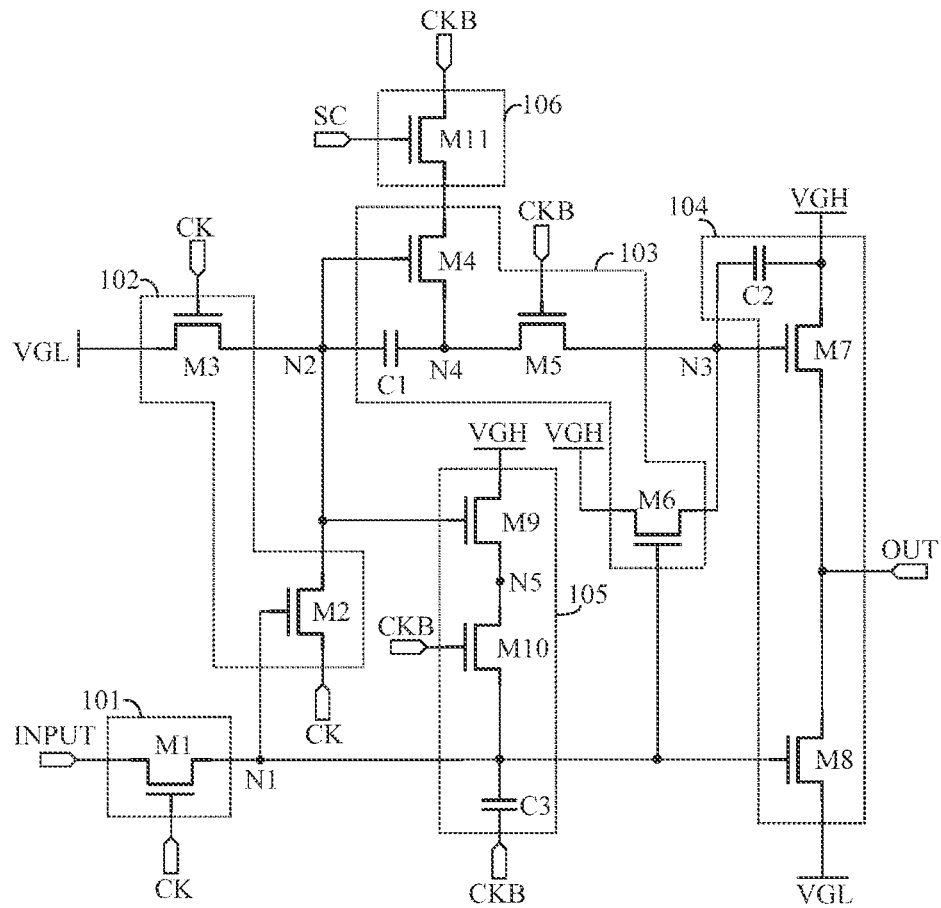

FIG. 7b is a schematic diagram of an alternative circuit configuration of the second shift register at the first stage shown in FIG. 7a, and as shown in FIG. 7b, specific circuits of the signal writing circuit 101, the first control circuit 102, the second control circuit 103 and the signal output circuit 104 in FIG. 7b may adopt those as shown in FIG. 4.

It should be noted that the case shown in FIG. 7b only serves as an example, and in the embodiment of the present disclosure, the signal writing circuit 101, the first control circuit 102, the second control circuit 103, and the signal output circuit 104 may also adopt other circuit configurations, which are not illustrated here.

With continued reference to FIGS. 6b and 7b, in some implementations, the first switch circuit 106 includes an eleventh transistor M11. In a case where the first switch circuit 106 is disposed between the signal output circuit 104 and the second power supply terminal, a control electrode of the eleventh transistor M11 is coupled to a switch control terminal SC, a first electrode of the eleventh transistor M11 is coupled to the second power supply terminal, and a second electrode of the eleventh transistor M11 is coupled to the signal output circuit 104; in a case where the first switch circuit 106 is disposed between the second control circuit 103 and the second clock signal terminal CKB, the control electrode of the eleventh transistor M11 is coupled to the switch control terminal SC, the first electrode of the eleventh transistor M11 is coupled to the second clock signal terminal CKB, and the second electrode of the eleventh transistor M11 is coupled to the second control circuit 103.

It should be noted that FIG. 7b only illustrates a case where the first switch circuit 106 (the eleventh transistor M11) is disposed between the second clock signal terminal and the first electrode of the fourth transistor M4, certainly, the first switch circuit 106 (the eleventh transistor M11) may also be disposed between the second clock signal terminal and the control electrode of the fifth transistor M5.

Figure 8:
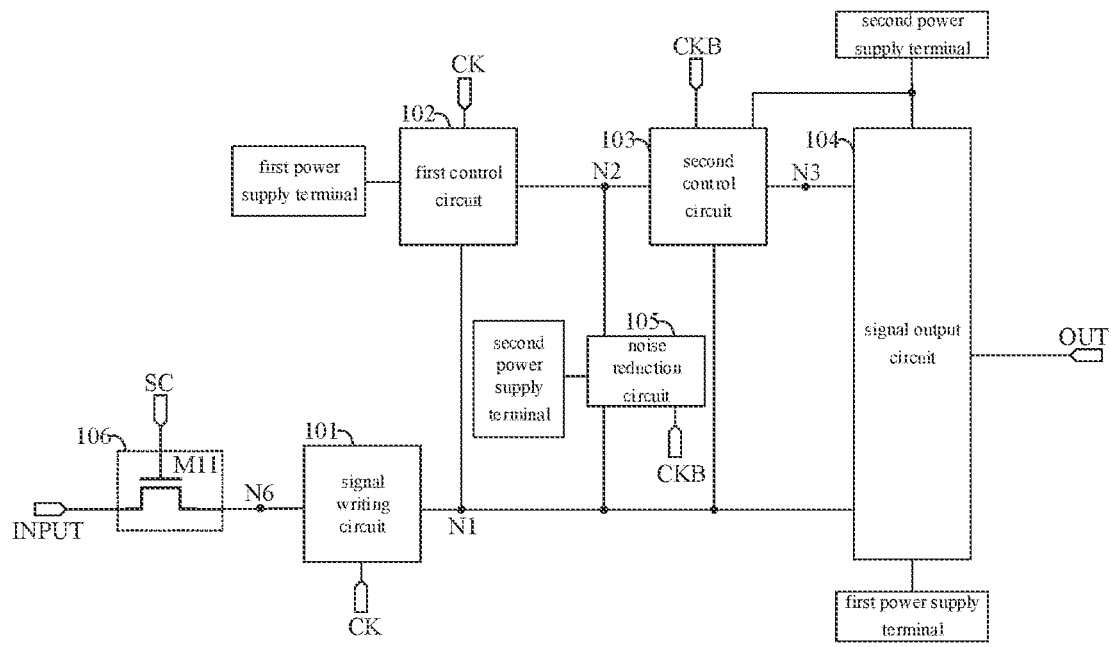
FIG. 8 is a schematic diagram of another circuit configuration of the second shift register at the first stage according to an embodiment of the present disclosure.

FIG. 8 is a schematic diagram of another circuit configuration of the second shift register at the first stage in the embodiment of the present disclosure, as shown in FIG. 8, unlike the cases shown in FIGS. 6a to 7b, in the case shown in FIG. 8, the first switch circuit 106 is disposed between the signal writing circuit 101 and the signal input terminal INPUT, and the first switch circuit 106 is configured to allow a current between the signal writing circuit 101 and the signal input terminal INPUT or not in response to the control of a first switch control signal provided by the first switch control terminal SC.

Specifically, when the first switch circuit 106 is turned on, a current is allowed between the signal writing circuit 101 in the second shift register B_1 at the first stage and the signal input terminal INPUT, the second shift register B_1 at the first stage can operate normally, and the frequency doubling function of the gate driving circuit is switched on, when the first switch circuit 106 is turned off, no current is allowed between the signal writing circuit 101 in the second shift register B_1 at the first stage and the signal input terminal INPUT, the second shift register B_1 at the first stage cannot operate normally, and the frequency doubling function of the gate driving circuit is switched off.

In some implementations, the first switch circuit 106 includes: a eleventh transistor M11, a control electrode of the eleventh transistor M11 is coupled to the first switch control terminal SC, a first electrode of the eleventh transistor M11 is coupled to the signal input terminal INPUT, and a second electrode of the eleventh transistor M11 is coupled to the signal writing circuit 101.

When no current is allowed between the signal writing circuit 101 and the signal input terminal INPUT, a terminal N6 of the signal writing circuit 101 for coupling with the signal input terminal INPUT is in a floating state and is susceptible to external interference, so that voltage deviation occurs on the terminal, when a voltage of the terminal N6 of the signal writing circuit 101 for coupling with the signal input terminal INPUT is deviated to a high level state, the second shift register at the first stage may generate an output by mistake, and the second shift registers at the following stages each may also generate an output by mistake, so that the "frequency doubling function" of the gate driving circuit is abnormally switched on.

Figure 9:
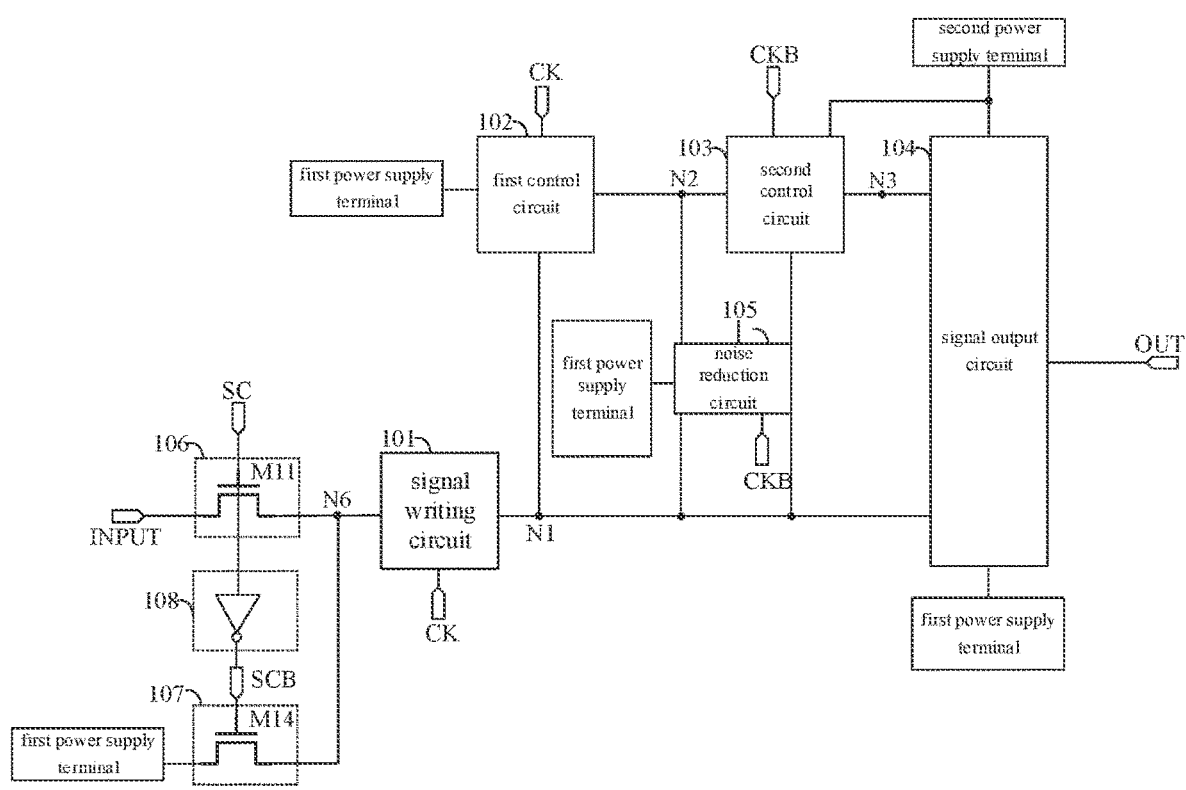
FIG. 9 is a schematic diagram of another circuit configuration of the second shift register at the first stage according to an embodiment of the present disclosure.

In order to solve the technical problem of abnormal switch-on of the frequency doubling function of the gate driving circuit, the embodiment of the disclosure provides a corresponding solution. FIG. 9 is a schematic diagram of another circuit configuration of the second shift register at the first stage in the embodiment of the disclosure, and unlike the case shown in FIG. 8, in a case shown in FIG. 9, the second shift register at the first stage in the frequency doubling control circuit is configured with a first power supply circuit 107, the first power supply circuit 107 is coupled to the signal writing circuit 101, the first switch circuit 106, the first power supply terminal, and a second switch control terminal SCB, and the first power supply circuit 107 is configured to write the first operating voltage to the signal writing circuit 101 in response to a control of a second switch control signal provided by the second switch control terminal SCB.

In the embodiment of the present disclosure, when the first switch circuit 106 allows a current between the signal writing circuit 101 and the signal input terminal INPUT or not, the first power supply circuit 107 may be controlled to operate by the second switch control signal. Specifically, the first power supply circuit 107 writes the first operating voltage into the terminal N6 of the signal writing circuit 101 for coupling with the signal input terminal INPUT to maintain the voltage at the terminal stable, so as to prevent the "frequency doubling function" of the gate driving circuit from being abnormally switched on.

Referring to FIG. 9, in some implementations, the first power supply circuit 107 includes: a fourteenth transistor M14, a control electrode of the fourteenth transistor M14 is coupled to the second switch control terminal SCB, a first electrode of the fourteenth transistor M14 is coupled to the first power supply terminal, and a second electrode of the fourteenth transistor M14 is coupled to the signal writing circuit 101 and the first switch circuit 106.

Specific circuits of the signal writing circuits 101, the first control circuits 102, the second control circuits 103, and the signal output circuits 104 in FIGS. 8 and 9 may adopt those shown in FIG. 4.

Figure 10:
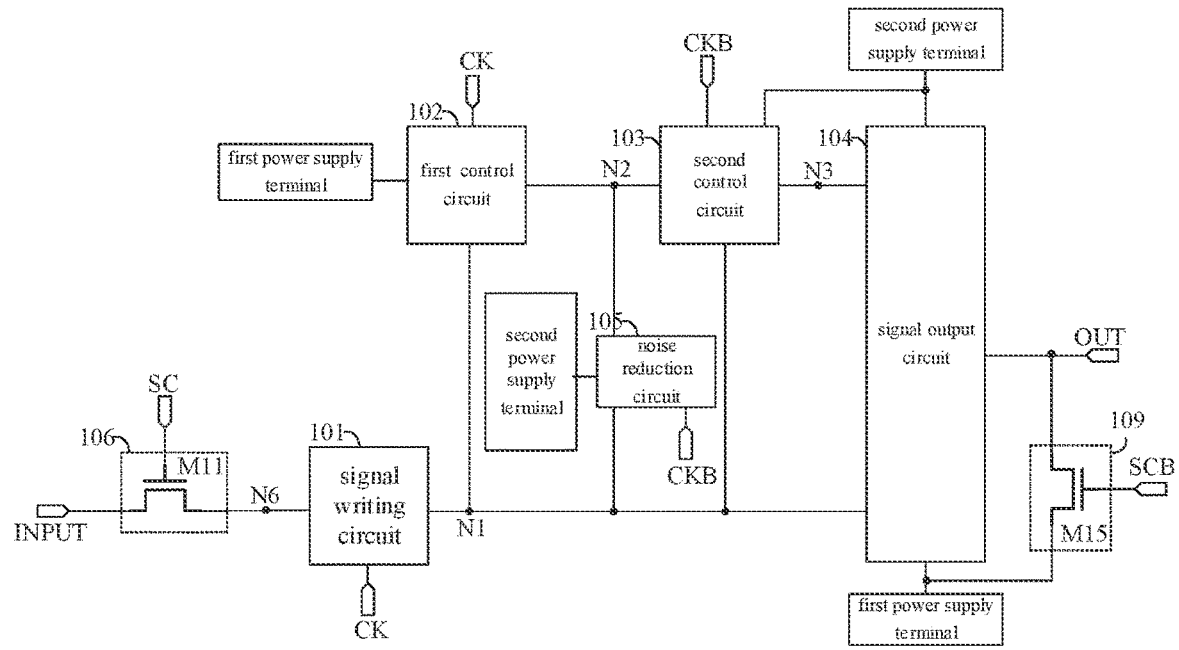
FIG. 10 is a schematic diagram of another circuit configuration of the second shift register at the first stage according to an embodiment of the present disclosure.

FIG. 10 is a schematic diagram of another circuit configuration of the second shift register provided in the embodiment of the present disclosure, and as shown in FIG. 10, in some implementations, in the frequency doubling control circuit 1, the second shift register at the first stage is configured with the first switch circuit 106 and a second power supply circuit 109. For the specific implementation of the first switch circuit, reference may be made to the contents in the foregoing embodiment (FIG. 10 only exemplarily shows that the first switch circuit 106 adopts the case shown in FIG. 9), and details are not repeated herein; only the second power supply circuit will be described in detail below.

The second power supply circuit 109 is coupled to the first power supply terminal, the signal output terminal OUT of the second shift register B_1 at the first stage, and the second switch control terminal SCB, the second power supply circuit 109 is configured to write the first operating voltage into the signal output terminal OUT of the second shift register B_1 at the first stage in response to the control of the second switch control signal provided by the second switch control terminal SCB.

When no current is allowed, by the first switch circuit 10, between the signal output circuit and the second power supply terminal (the first switch circuit 106 shown in FIG. 6a is provided between the signal output circuit and the second power supply terminal), or between the second control circuit 103 and the second clock signal terminal (the first switch circuit 106 shown in FIG. 7a is provided between the second control circuit 103 and the second clock signal terminal CKB), or between the signal writing circuit 101 and the signal input terminal INPUT (the first switch circuit 106 shown in FIG. 8 is provided between the signal writing circuit 101 and the signal input terminal INPUT), the second power supply circuit 109 may be controlled by the second switch control signal to write the first operating voltage into the signal output terminal OUT of the second shift register coupled thereto, the signal output terminal OUT of the second shift register B_1 at the first stage is subjected to noise reduction processing, so that abnormal switch-on of a frequency doubling function of the gate driving circuit can be avoided.

In some implementations, the second power supply circuit 109 includes: a fifteenth transistor M15; a control electrode of the fifteenth transistor M15 is coupled to the second switch control terminal SCB, a first electrode of the fifteenth transistor M15 is coupled to the first power supply terminal, and a second electrode of the fifteenth transistor M15 is coupled to the signal output terminal OUT of the second shift register B_1 at the first stage.

Figure 11:
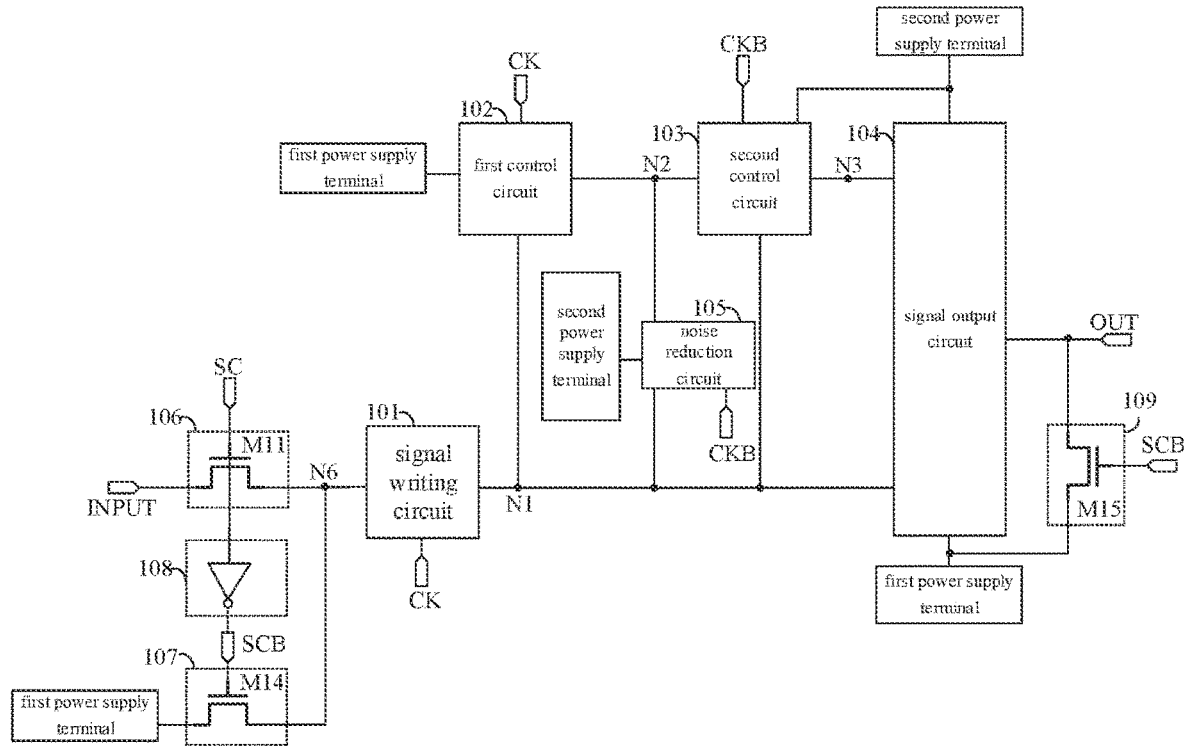
FIG. 11 is a schematic diagram of another circuit configuration of the second shift register at the first stage according to an embodiment of the present disclosure.

FIG. 11 is a schematic diagram of another circuit configuration of the second shift register at the first stage in the embodiment of the disclosure, and as shown in FIG. 11, unlike the cases shown in FIG. 9 and FIG. 10, the second shift register B_1 at the first stage shown in FIG. 11 is configured with the first power supply circuit 107 (including the fourteenth transistor M14) and the second power supply circuit 109 (including the fifteenth transistor M15) at the same time.

In some implementations, the gate driving circuit further includes: an inverter circuit 108, an input terminal of the inverter circuit 108 is coupled to the first switch control terminal SC, an output terminal of the inverter circuit 108 is coupled to the second switch control terminal SCB, the inverter circuit 108 is configured to invert a signal at the input terminal. Specifically, the inverter circuit 108 can invert the first switch control signal provided by the first switch control terminal SC, so as to obtain the second switch control signal. In such case, for two different switch control terminals SC, SCB, only one switch control signal needs to be provided by the external chip.

In some implementations, in the effective output circuit 2, the first signal input terminal INPUT and the second signal input terminal INPUT' of the first shift register A_1 at the first stage are the same signal input terminal, that is, the first shift register A_1 at the first stage is configured with one signal input terminal coupled to both the output control signal terminal and the signal output terminal OUT of the frequency doubling control circuit 1 for outputting the frequency doubling control signal.

Figure 12A:
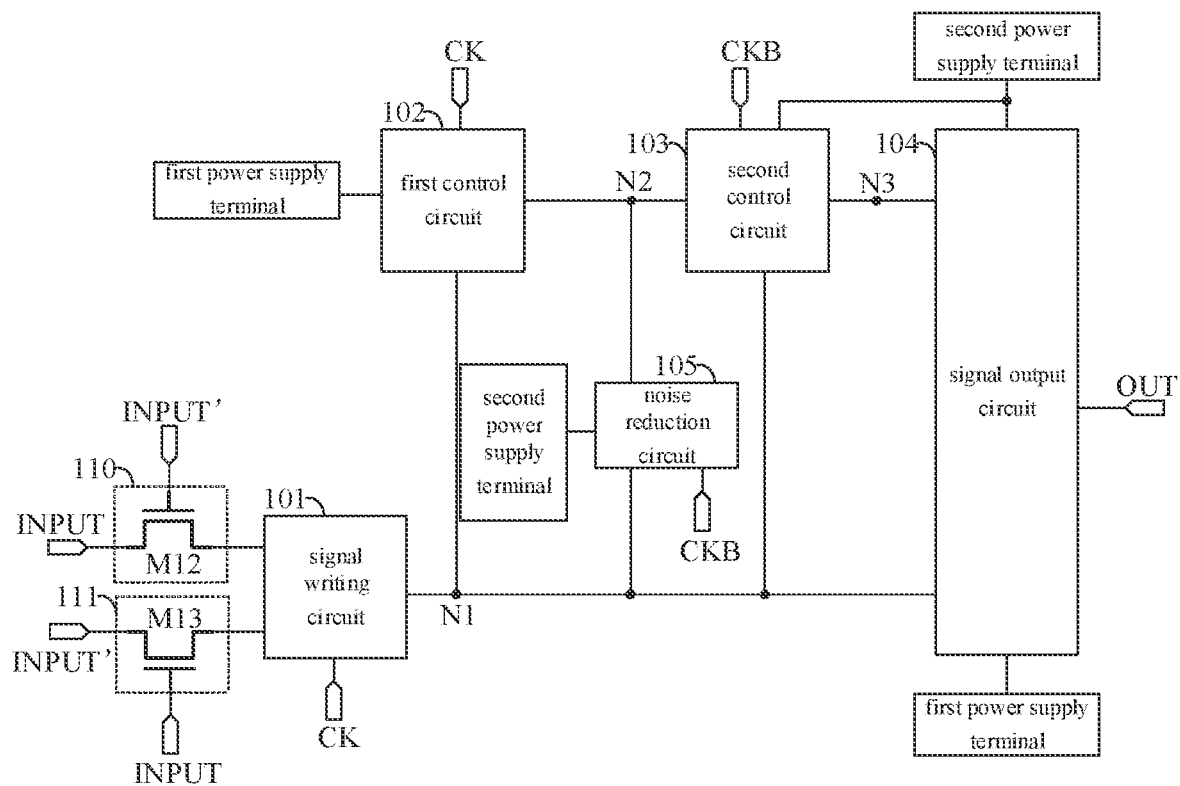
FIG. 12a is a schematic diagram of a circuit configuration of a first shift register at a first stage according to an embodiment of the present disclosure.

FIG. 12a is a schematic diagram of a circuit configuration of a first shift register at a first stage according to an embodiment of the present disclosure, and as shown in FIG. 12a, in some implementations, the first signal input terminal INPUT and the second signal input terminal INPUT' of the first shift register A_1 at the first stage are different signal input terminals; the first shift register A_1 at the first stage further includes: a second switch circuit 110 and a third switch circuit 111.

The second switch circuit 110 is disposed between the signal writing circuit 101 in the first shift register at the first stage and the first signal input terminal INPUT, and is coupled to the second signal input terminal INPUT', and the second switch circuit 110 is configured to allow a current between the signal writing circuit 101 and the first signal input terminal INPUT or not in response to the control of the signal provided by the second signal input terminal INPUT'.

The third switch circuit 111 is disposed between the signal writing circuit 101 in the first shift register A_1 at the first stage and the second signal input terminal INPUT' and is coupled to the first signal input terminal INPUT, and the third switch circuit 111 is configured to allow a current between the signal writing circuit 101 and the second signal input terminal INPUT' or not in response to a control of a signal provided from the first signal input terminal INPUT.

In some implementations, the second switch circuit 110 includes a twelfth transistor M12, the third switch circuit 111 includes a thirteenth transistor M14. A control electrode of the twelfth transistor M12 is coupled to the second signal input terminal INPUT', a first electrode of the twelfth transistor M12 is coupled to the first signal input terminal INPUT, and a second electrode of the twelfth transistor M12 is coupled to the signal writing circuit 101; a control electrode of the thirteenth transistor M14 is coupled to the first signal input terminal INPUT, a first electrode of the thirteenth transistor M14 is coupled to the second signal input terminal INPUT', and a second electrode of the thirteenth transistor M14 is coupled to the signal writing circuit 101.

Figure 12B:
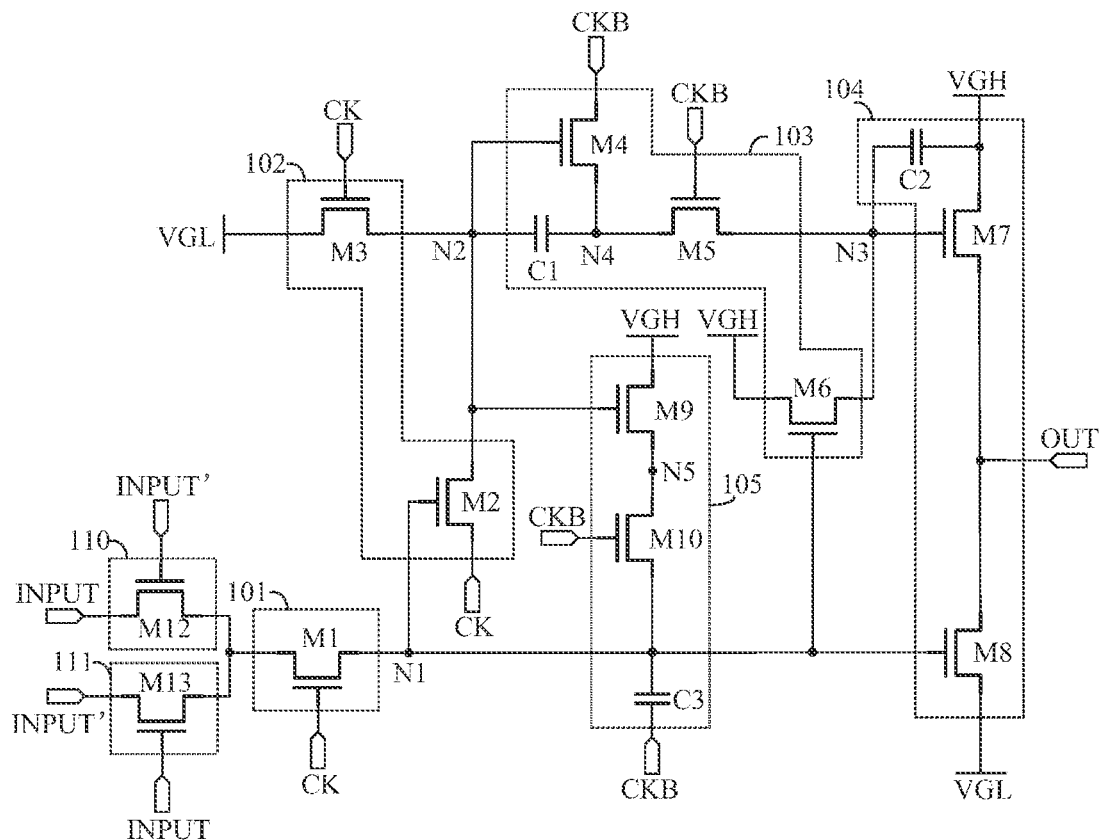

FIG. 12b is a schematic diagram of an alternative circuit configuration of the first shift register in the first stage shown in FIG. 12a, and as shown in FIG. 12b, specific circuits of the signal writing circuit 101, the first control circuit 102, the second control circuit 103, and the signal output circuit 104 in FIG. 12b may adopt those shown in FIG. 4.

It should be noted that the case shown in FIG. 12b only serves as an example, and in the embodiment of the present disclosure, the signal writing circuit 101, the first control circuit 102, the second control circuit 103, and the signal output circuit 104 may also adopt other circuit configurations, which are not illustrated here.

An embodiment of the present disclosure further provides a display substrate, where the display substrate includes the gate driving circuit provided in the embodiments and a plurality of gate lines located in a display area; the gate line is coupled to a signal output terminal of a corresponding first shift register in the gate driving circuit, and for a detailed description of the gate driving circuit, reference may be made to the contents in the foregoing embodiments, which are not described herein again.

An embodiment of the present disclosure further provides a display device, which includes the display substrate provided in the above embodiment and an opposite substrate disposed opposite to the display substrate, and for specific description of the display substrate, reference may be made to the contents in the foregoing embodiment, and details are not repeated here.

The display device may be any product or component with a display function, such as electronic paper, a liquid crystal display panel, an LED panel, an OLED panel, a mobile phone, a tablet computer, a television, a display, a notebook computer, a digital photo frame, and a navigator.

Figure 13:
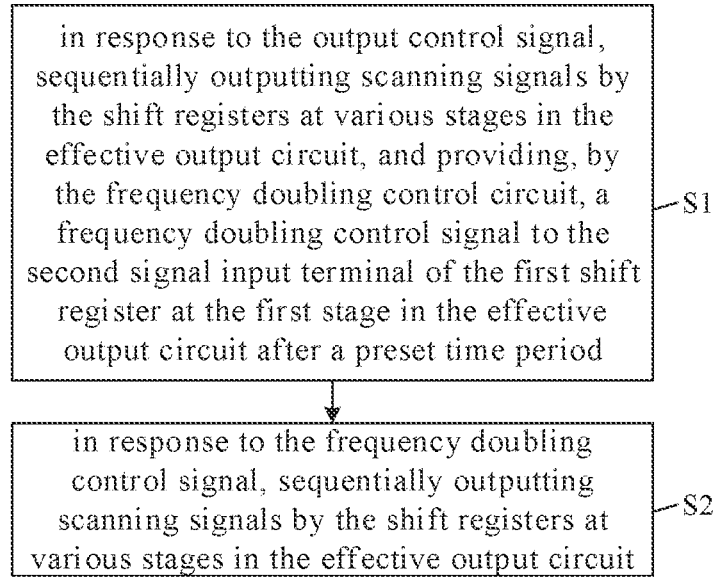
FIG. 13 is a flowchart of a gate driving method according to an embodiment of the present disclosure.

FIG. 13 is a flowchart of a gate driving method provided in an embodiment of the present disclosure, and as shown in FIG. 13, the gate driving method is based on the gate driving circuit provided in the foregoing embodiments, and the gate driving method includes:

step S1, in response to the output control signal, the shift registers at various stages in the effective output circuit sequentially output scanning signals, and the frequency doubling control circuit provides a frequency doubling control signal to the second signal input terminal of the first shift register at the first stage in the effective output circuit after a preset time period;

step S2, in response to the frequency doubling control signal, the shift registers at various stages in the effective output circuit sequentially output scanning signals.

For the specific description of step S1 and step S2, reference may be made to the corresponding contents in the foregoing embodiments, and details are not repeated here.

According to the technical solution, the frequency doubling control circuit is further arranged on the basis of the effective output circuit, the frequency doubling control circuit can provide a frequency doubling control signal to the second signal input terminal after the output control signal is received for a preset time period, so that the effective output circuit can realize frequency doubling output, namely, the upper limit of the frequency of the scanning signal output by the gate driving circuit is increased, and the phenomenon, that the OLED flickers in a mode recognizable by naked eyes, occurring due to the fact that the frequency of the PWM signal is too low can be effectively avoided.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

The invention claimed is:

1. A gate driving circuit, comprising: a frequency doubling control circuit and an effective output circuit, the effective output circuit comprises a plurality of first shift registers cascaded, the first shift register at a first stage in the effective output circuit is provided with a first signal input terminal and a second signal input terminal, the first signal input terminal is coupled with an output control signal line, the second signal input terminal is coupled with the frequency doubling control circuit, each of other first shift registers except the first shift register at the first stage in the effective output circuit is provided with a first cascade signal input terminal, and the first cascade signal input terminal of each of the other first shift registers is coupled with a signal output terminal of the first shift register in a previous stage corresponding thereto;
the frequency doubling control circuit is coupled with the output control signal line and configured to provide, in response to a control of an output control signal provided by the output control signal line, a frequency doubling control signal to the second signal input terminal after a preset time period elapses from receiving of the output control signal; and
the first shift register at the first stage is configured to output a scanning signal in response to a control of the output control signal and to output a scanning signal in response to a control of the frequency doubling control signal,
wherein in the frequency doubling control circuit, the second shift register comprises: a signal writing circuit, a first control circuit, a second control circuit and a signal output circuit;
the signal writing circuit, the first control circuit, the second control circuit, and the signal output circuit are coupled to a first node, both the first control circuit and the second control circuit are coupled to a second node, and both the second control circuit and the signal output circuit are coupled to a third node;
the signal writing circuit is coupled with a corresponding signal input terminal and a first clock signal terminal and is configured to write, in response to a control of a first clock signal provided by the first clock signal terminal, a signal provided by the corresponding signal input terminal into the first node;
the first control circuit is coupled with a first power supply terminal and the first clock signal terminal, and is configured to write a first operating voltage provided by the first power supply terminal into the second node in response to the control of the first clock signal, and to write the first clock signal into the second node in response to a control of a voltage at the first node;
the second control circuit is coupled to a second power supply terminal and a second clock signal terminal, and is configured to write a second clock signal into the third node in response to a control of a voltage at the second node and the second clock signal provided by the second clock signal terminal, and to write a second operating voltage provided by the second power supply terminal into the third node in response to the control of the voltage at the first node;
the signal output circuit is coupled with the first power supply terminal and the second power supply terminal, and is configured to write the first operating voltage into the signal output terminal in response to the control of the voltage at the first node, and to write the second operating voltage into the signal output terminal in response to a control of a voltage at the third node, and
wherein in the effective output circuit, the first signal input terminal and the second signal input terminal of the first shift register at the first stage are different signal input terminals;
the first shift register at the first stage is provided with a second switch circuit and a third switch circuit;
the second switch circuit is located between the signal writing circuit and the first signal input terminal, is coupled with the second signal input terminal, and is configured to write, in response to a control of a signal provided by the second signal input terminal, a signal provided by the first signal input terminal into the signal writing circuit;
the third switch circuit is arranged between the signal writing circuit and the second signal input terminal, is coupled with the first signal input terminal, and is configured to write, in response to a control of the signal provided by the first signal input terminal, signal provided by the second signal input terminal into the signal writing circuit.

2. The gate driving circuit of claim 1, wherein the frequency doubling control circuit comprises a plurality of second shift registers cascaded;
the second shift register at a first stage in the frequency doubling control circuit is provided with a third signal input terminal, and the third signal input terminal is coupled with the output control signal line;
each of other second shift registers except the second shift register at the first stage is provided with a second cascade signal input terminal, the second cascade signal input terminal of each of the other second shift registers is coupled with a signal output terminal of the second shift register at a previous stage corresponding thereto; and
the signal output terminal of the second shift register at the last stage in the frequency doubling control circuit is coupled with the second signal input terminal.

3. The gate driving circuit of claim 1, wherein the signal writing circuit comprises a first transistor; the first control circuit comprises a second transistor and a third transistor; the second control circuit comprises a fourth transistor, a fifth transistor, a sixth transistor, and a first capacitor; the signal output circuit comprises a seventh transistor, an eighth transistor, and a second capacitor, a control electrode of the first transistor is coupled to the first clock signal terminal, a first electrode of the first transistor is coupled to the signal input terminal, and a second electrode of the first transistor is coupled to the first node;

a control electrode of the second transistor is coupled to the first node, a first electrode of the second transistor is coupled to the first clock signal terminal, and a second electrode of the second transistor is coupled to the second node;

a control electrode of the third transistor is coupled to the first clock signal terminal, a first electrode of the third transistor is coupled to the first power supply terminal, and a second electrode of the third transistor is coupled to the second node;

a control electrode of the fourth transistor is coupled to the second node, a first electrode of the fourth transistor is coupled to the second clock signal terminal, and a second electrode of the fourth transistor is coupled to a first electrode of the fifth transistor;

a control electrode of the fifth transistor is coupled to the second clock signal terminal, and a second electrode of the fifth transistor is coupled to the third node;

a control electrode of the sixth transistor is coupled to the first node, a first electrode of the sixth transistor is coupled to the second power supply terminal, and a second electrode of the sixth transistor is coupled to the third node;

a first electrode of the first capacitor is coupled to the second node, and a second electrode of the first capacitor is coupled to the second electrode of the fourth transistor;

a control electrode of the seventh transistor is coupled to the third node, a first electrode of the seventh transistor is coupled to the second power supply terminal, and a second electrode of the seventh transistor is coupled to the signal output terminal;

a control electrode of the eighth transistor is coupled to the first node, a first electrode of the eighth transistor is coupled to the first power supply terminal, and a second electrode of the eighth transistor is coupled to the signal output terminal;

a first electrode of the second capacitor is coupled to the third node, and a second electrode of the third capacitor is coupled to the second power supply terminal.

4. The gate driving circuit of claim 1, wherein the second shift register further comprises: a noise reduction circuit;

the noise reduction circuit is coupled to the first node, the second node, the second power supply terminal, and the second clock signal terminal, and configured to perform noise reduction on the voltage at the first node in response to the control of the second clock signal and the voltage at the second node.

5. The gate driving circuit of claim 4, wherein the noise reduction circuit comprises: a ninth transistor, a tenth transistor, and a third capacitor;

a control electrode of the ninth transistor is coupled to the second node, a first electrode of the ninth transistor is coupled to the second power supply terminal, and a second electrode of the ninth transistor is coupled to a first electrode of the tenth transistor;

a control electrode of the tenth transistor is coupled to the second clock signal terminal, and a second electrode of the tenth transistor is coupled to the first node;

a first electrode of the third capacitor is coupled to the first node, and a second electrode of the third capacitor is coupled to the second clock signal terminal.

6. The gate driving circuit of claim 1, wherein each first shift register in the effective output circuit has the same circuit configuration as each second shift register in the frequency doubling control circuit.

7. The gate driving circuit of claim 6, wherein in the effective output circuit, the first signal input terminal and the second signal input terminal of the first shift register at the first stage are the same signal input terminal.

8. The gate driving circuit of claim 1, wherein the second switch circuit comprises a twelfth transistor, the third switch circuit comprises a thirteenth transistor;

a control electrode of the twelfth transistor is coupled to the second signal input terminal, a first electrode of the twelfth transistor is coupled to the first signal input terminal, and a second electrode of the twelfth transistor is coupled to the signal writing circuit;

a control electrode of the thirteenth transistor is coupled to the first signal input terminal, a first electrode of the thirteenth transistor is coupled to the second signal input terminal, and a second electrode of the thirteenth transistor is coupled to the signal writing circuit.

9. The gate driving circuit of claim 1, wherein in the frequency doubling control circuit, the second shift register at the first stage is configured with a first switch circuit disposed between the signal output circuit and the second power supply terminal and coupled to a first switch control terminal, and is configured to allow a current between the signal output circuit and the second power supply terminal in response to a control of a first switch control signal provided by the first switch control terminal.

10. The gate driving circuit of claim 9, wherein the first switch circuit comprises: an eleventh transistor;

a control electrode of the eleventh transistor is coupled to a first switch control terminal, a first electrode of the eleventh transistor is coupled to the second power supply terminal, and a second electrode of the eleventh transistor is coupled to the signal output circuit.

11. The gate driving circuit of claim 9, wherein in the frequency doubling control circuit, the second shift register at the first stage is configured with a second power supply circuit;

the second power supply circuit is coupled to the first power supply terminal, the signal output terminal of the second shift register at the first stage, and a second switch control terminal, and is configured to write the first operating voltage into the signal output terminal of the second shift register in response to a control of a second switch control signal provided by the second switch control terminal.

12. The gate driving circuit of claim 11, wherein the second power supply circuit comprises: a fifteenth transistor;

a control electrode of the fifteenth transistor is coupled to the second switch control terminal, a first electrode of the fifteenth transistor is coupled to the first power supply terminal, and a second electrode of the fifteenth transistor is coupled to the signal output terminal of the second shift register at the first stage.

13. The gate driving circuit of claim 1, wherein in the frequency doubling control circuit, the second shift register at the first stage is configured with a first switch circuit, the first switch circuit is disposed between the second control circuit and the second clock signal terminal, and is configured to allow a current between the second control circuit and the second clock signal terminal in response to a control of a first switch control signal provided by the first switch control terminal.

14. The gate driving circuit of claim 13, wherein the first switch circuit comprises: an eleventh transistor;
a control electrode of the eleventh transistor is coupled to a first switch control terminal, a first electrode of the eleventh transistor is coupled to the second clock signal terminal, and a second electrode of the eleventh transistor is coupled to the second control circuit.

15. The gate driving circuit of claim 1, wherein in the frequency doubling control circuit, the second shift register at the first stage is configured with a first switch circuit, which is disposed between the signal writing circuit and the signal input terminal and coupled to a first switch control terminal, and is configured to allow a current between the signal writing circuit and the signal input terminal or not in response to a control of a first switch control signal provided by the first switch control terminal.

16. The gate driving circuit of claim 15, wherein the first switch circuit comprises: an eleventh transistor;
a control electrode of the eleventh transistor is coupled to the first switch control terminal, a first electrode of the eleventh transistor is coupled to the signal input terminal, and a second electrode of the eleventh transistor is coupled to the signal writing circuit.

17. The gate driving circuit of claim 15, wherein in the frequency doubling control circuit, the second shift register at the first stage is configured with a first power supply circuit;
the first power supply circuit is coupled to the signal writing circuit, the first switch circuit, the first power supply terminal, and the second switch control terminal, and is configured to write the first operating voltage into the signal writing circuit in response to a control of a second switch control signal provided by the second switch control terminal.

18. The gate driving circuit of claim 17, wherein the first power supply circuit comprises: a fourteenth transistor;
a control electrode of the fourteenth transistor is coupled to the second switch control terminal, a first electrode of the fourteenth transistor is coupled to the first power supply terminal, and a second electrode of the fourteenth transistor is coupled to the signal writing circuit and the first switch circuit.

19. The gate driving circuit of claim 17, further comprising: an inverter circuit, an input terminal of the inverter circuit is coupled with the first switch control terminal, and an output terminal of the inverter circuit is coupled with the second switch control terminal.

20. A display substrate, comprising: the gate driving circuit of claim 1 and a plurality of gate lines in a display area;
the gate lines are coupled with signal output terminals of corresponding first shift registers in the gate driving circuit one to one.

21. A display device, comprising: the display substrate of claim 20 and an opposite substrate arranged opposite to the display substrate.

22. A gate driving method, which is based on the gate driving circuit of claim 1, and comprises:
in response to the output control signal, sequentially outputting scanning signals by the shift registers at various stages in the effective output circuit, and providing, by the frequency doubling control circuit, a frequency doubling control signal to the second signal input terminal of the first shift register at the first stage in the effective output circuit after a preset time period;
in response to the frequency doubling control signal, sequentially outputting scanning signals by the shift registers at various stages in the effective output circuit.

* * * * *